United States Patent
Kim et al.

(10) Patent No.: US 9,202,789 B2
(45) Date of Patent: Dec. 1, 2015

(54) DIE PACKAGE COMPRISING DIE-TO-WIRE CONNECTOR AND A WIRE-TO-DIE CONNECTOR CONFIGURED TO COUPLE TO A DIE PACKAGE

(71) Applicant: QUALCOMM Incorporated, San Diego, CA (US)

(72) Inventors: Daeik Daniel Kim, San Diego, CA (US); Mario Francisco Velez, San Diego, CA (US); Jonghae Kim, San Diego, CA (US); Matthew Michael Nowak, San Diego, CA (US); Chengjie Zuo, Santee, CA (US); Changhan Hobie Yun, San Diego, CA (US); David Francis Berdy, San Diego, CA (US); Robert Paul Mikulka, Oceanside, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/254,764

(22) Filed: Apr. 16, 2014

(65) Prior Publication Data
US 2015/0303148 A1    Oct. 22, 2015

(51) Int. Cl.
| | |
|---|---|
| H01L 23/48 | (2006.01) |
| H01L 23/552 | (2006.01) |
| H01L 23/31 | (2006.01) |
| H01L 23/00 | (2006.01) |
| H01L 23/498 | (2006.01) |
| H01L 23/04 | (2006.01) |
| H01L 23/538 | (2006.01) |
| H05K 9/00 | (2006.01) |

(52) U.S. Cl.
CPC .............. *H01L 23/552* (2013.01); *H01L 23/04* (2013.01); *H01L 23/3107* (2013.01); *H01L 23/49838* (2013.01); *H01L 23/5386* (2013.01); *H01L 24/17* (2013.01); *H05K 9/0032* (2013.01); *H01L 2224/16113* (2013.01); *H01L 2224/16227* (2013.01)

(58) Field of Classification Search
USPC ......... 257/678–733, 787–796, 100, 433, 434, 257/667, E31.117–E31.118, E51.02, 257/E23.116–E23.14; 438/15, 25, 51, 55, 438/64–67, 112, 124, 126, 127
See application file for complete search history.

(56) References Cited

U.S. PATENT DOCUMENTS

| | | |
|---|---|---|
| 6,380,563 B2 | 4/2002 | Farnworth et al. |
| 6,945,712 B1 | 9/2005 | Conn |
| 7,247,942 B2 | 7/2007 | Nguyen et al. |
| 7,803,017 B2 | 9/2010 | Voutilainen |

(Continued)

*Primary Examiner* — Dao H Nguyen
*Assistant Examiner* — Tram H Nguyen
(74) *Attorney, Agent, or Firm* — Loza & Loza, LLP

(57) ABSTRACT

Some novel features pertain to an integrated device package (e.g., die package) that includes a package substrate, a die, an encapsulation layer and a first set of metal layers. The package substrate includes a first surface and a second surface. The die is coupled to the first surface of the package substrate. The encapsulation layer encapsulates the die. The first set of metal layers is coupled to a first exterior surface of the encapsulation layer. In some implementations, the first set of metal layers is configured to operate as a die-to-wire connector of the integrated device package. In some implementations, the integrated device package includes a second set of metal layers coupled to the second surface of the package substrate. In some implementations, the integrated device package includes a second set of metal layers coupled to a second exterior surface of the encapsulation layer.

34 Claims, 14 Drawing Sheets

(56) References Cited

U.S. PATENT DOCUMENTS

| | | | |
|---|---|---|---|
| 2005/0133901 A1 | 6/2005 | Edwards et al. | |
| 2008/0315389 A1* | 12/2008 | Nunn | H01L 23/3121 257/690 |
| 2009/0072374 A1* | 3/2009 | Dobritz | H01L 25/0657 257/686 |
| 2010/0025833 A1* | 2/2010 | Pagaila | H01L 21/561 257/686 |
| 2010/0207264 A1* | 8/2010 | Ono | H01L 21/561 257/690 |
| 2011/0031610 A1* | 2/2011 | Yamazaki | H01L 23/4985 257/693 |
| 2011/0272796 A1* | 11/2011 | Eaton | B81C 1/00269 257/682 |
| 2013/0240909 A1* | 9/2013 | Hiramatsu | H01L 23/24 257/77 |

* cited by examiner

Die Package

Connector

Die Package + Connector

Wire-to-Die Connector

Wire-to-Die Connector

Die Package

Connector

Die Package + Connector

Wire-to-Die Connector

Wire-to-Die Connector

2400

Provide (e.g., form, fabricate) a package substrate, the package substrate comprising at least one connector — 2405

Provide (e.g., form, fabricate) at least one wafer level die — 2410

Couple the wafer level die to the package substrate — 2415

Provide (e.g., form, fabricate) an encapsulation layer (e.g., mold) on the wafer level die — 2420

Provide (e.g., form, fabricate) at least one connector on the encapsulation layer — 2425

*FIG. 24*

DIE PACKAGE COMPRISING DIE-TO-WIRE CONNECTOR AND A WIRE-TO-DIE CONNECTOR CONFIGURED TO COUPLE TO A DIE PACKAGE

BACKGROUND

1. Field

Various features relate to a die package that includes a connector and a connector configured to couple to a die package.

2. Background

FIG. 1 illustrates a plan view of a conventional integrated device assembly 100. As shown in FIG. 1, the integrated device assembly 100 includes a printed circuit board (PCB) 102, a first die package 104, a second die package 106, a third die package 108, a first capacitor 110, a second capacitor 112, a third capacitor 114 and a fourth capacitor 116. The first die package 104, the second die package 106, the third die package 108, the first capacitor 110, the second capacitor 112, the third capacitor 114 and the fourth capacitor 116 are coupled to a surface of the PCB 102.

The PCB 102 includes a connection region 120. The connection region 120 of the PCB 102 includes a first connector 122, a second connector 124, and a third connector 126. The first connector 122, the second connector 124, and the third connector 126 are wire-to-board connectors. The first connector 122, the second connector 124, and the third connector 126 are configured to couple to a set of wire connectors. As shown in FIG. 1, the connectors 122, 124 and 126 take up a lot of space on the PCB 102.

FIG. 2 illustrates a profile view of the cross-section AA of the integrated device assembly 100 of FIG. 1. FIG. 2 illustrates the PCB 102, the first die package 104, the third die package 108, the first capacitor 110, the second capacitor 112, the third capacitor 114, and the fourth capacitor 116. FIG. 2 also illustrates the second connector 124 coupled to the PCB 102. The second connector 124 is configured to be coupled to a connector header 200. The connector header 200 is coupled to a power source (e.g., battery). The connector header 200 provides a power signal that traverses the second connector 124, through the PCB 102, through at least one capacitor (e.g., second capacitor 112), and then to the second die package 106.

This configuration of the assembly 100 has a few drawbacks. One, as mentioned above, the connectors 122, 124 and 126 take up a lot of valuable space on the PCB 102. This limits how small the assembly 100 can be. Second, the addition of the connectors 122, 124, and 126 increases the distance that a power signal has to travel to a die package, which can lead to signal degradation, especially at low voltages. In turn signal degradation can lead to poor performances of integrated circuits in a die package. Third, the additional connectors 122, 124 and 126 can add undesirable cost and weight to the assembly 100.

Therefore, there is a need for a cost effective integrated device assembly that has a low profile but also takes up a little real estate as possible. Ideally, such an integrated device assembly.

SUMMARY

Various features, apparatus and methods described herein provide a die package that includes a connector and a connector configured to couple to a die package.

A first example provides an integrated device package that includes a package substrate, a die, an encapsulation layer and a first set of metal layers. The package substrate includes a first surface and a second surface. The die is coupled to the first surface of the package substrate. The encapsulation layer encapsulates the die. The first set of metal layers is coupled to a first exterior surface of the encapsulation layer.

According to an aspect, the integrated device package further includes a second set of metal layers coupled to the second surface of the package substrate. In some implementations, the integrated device package further includes a set of solder balls coupled to the second set of metal layers.

According to one aspect, the first set of metal layers is configured to operate as a die-to-wire connector of the integrated device package.

According to an aspect, the integrated device package further includes a second set of metal layers coupled to a second exterior surface of the encapsulation layer, where the first exterior surface is a top surface of the encapsulation layer, and the second exterior surface is a side surface of the encapsulation layer. In some implementations, the integrated device package further includes a third set of metal layers coupled to the second surface of the package substrate, where the third set of metal layers is coupled to the second set of metal layers. In some implementations, the integrated device package is coupled to a carrier, the second set of metal layers being configured to directly couple to the carrier.

According to one aspect, the first set of metal layers is configured to provide an electrical path for one of at least a power signal and/or a data signal to the integrated device package.

According to an aspect, the integrated device package is one of at least a die package and/or a chip package.

According to one aspect, the integrated device package is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides an apparatus that includes a package substrate, a die, an encapsulation layer, and a first means. The package substrate includes a first surface and a second surface. The die is coupled to the first surface of the package substrate. The encapsulation layer encapsulates the die. The first means is configured to provide a die-to-wire electrical connection. The first means coupled to a first exterior surface of the encapsulation layer.

According to an aspect, the first means is further coupled to the second surface of the package substrate.

According to one aspect, the first means is further coupled to a second exterior surface of the encapsulation layer, where the first exterior surface is a top surface of the encapsulation layer, and the second exterior surface is a side surface of the encapsulation layer.

According to an aspect, the apparatus is coupled to a carrier, where the first is configured to directly couple to the carrier.

According to one aspect, the first means is configured to provide an electrical path for one of at least a power signal and/or a data signal to the apparatus.

According to an aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a wire-to-die device that includes a casing, a wire, wire casing, a set of wires, and a first set of metal layers. The casing includes a cavity, where the cavity is configured to couple to an integrated device package. The wire casing is to the casing. The set of wires is in the wire casing. The first set of metal layers is coupled to the set of wires. The first set of metal layers is located in the casing, where the first set of metal layers is configured to couple to a second set of metal layers of the integrated device package.

According to an aspect, the first set of metal layers and the set of wires are configured to provide an electrical path for one of at least a power signal and/or a data signal to the integrated device package.

According to one aspect, the wire-to-die device further includes a shield layer located within the casing.

According to an aspect, the cavity forms a first interior surface and a second interior surface in the casing. The first set of metal layers is coupled to the first interior surface of the casing. In some implementations, the wire-to-die device further includes a third set of metal layers coupled to the set of wires, where the third set of metal layers is coupled to the second interior surface of the casing.

According to one aspect, the wire-to-die device further includes a first set of interconnects coupled to the first set of metal layers, and a first set of interfaces coupled to the set of wires and the first set of interconnects.

According to an aspect, the wire-to-die device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A fourth example provides an apparatus that includes a casing, a wire casing, a set of wires, and a first means. The casing includes a cavity, where the cavity is configured to couple to an integrated device package. The wire casing is coupled to the casing. The set of wires is in the wire casing. The first means is configured to provide an electrical connection. The first means is coupled to the set of wires. The first means is located in the casing, where the first means is configured to couple to a second set of metal layers of the integrated device package.

According to an aspect, the first means and the set of wires are configured to provide an electrical path for one of at least a power signal and/or a data signal to the integrated device package.

According to one aspect, the apparatus includes a shielding means layer located within the casing.

According to an aspect, the cavity forms a first interior surface and a second interior surface in the casing, the first means being coupled to the first interior surface of the casing. In some implementations, the first means is further coupled to the second interior surface of the casing.

According to one aspect, the apparatus includes a first set of interconnects coupled to the first means, and a first interface means configured to couple the first set of interconnects and the set of wires.

According to an aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

FIG. 24 illustrates a flow diagram for a method for providing a die package that includes a die-to-wire connector.

DETAILED DESCRIPTION

Figure 1:
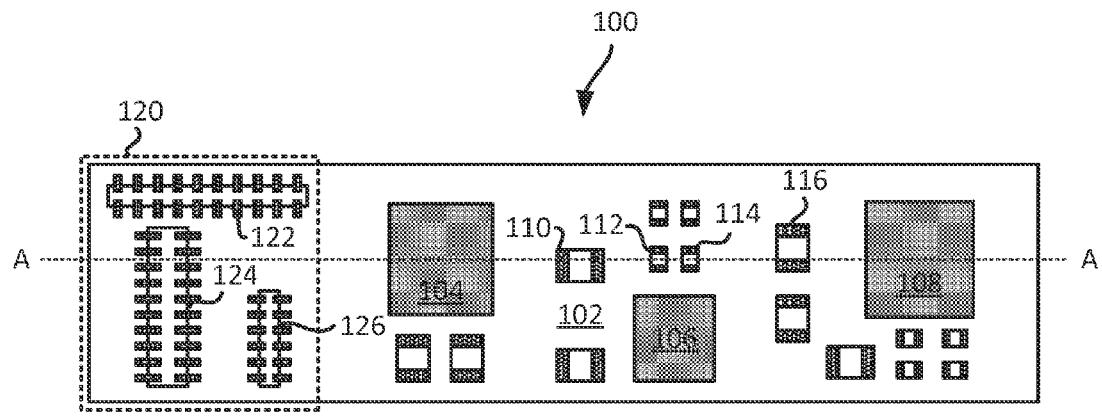
FIG. 1 illustrates a plan view of a conventional integrated device assembly.
Figure 2:
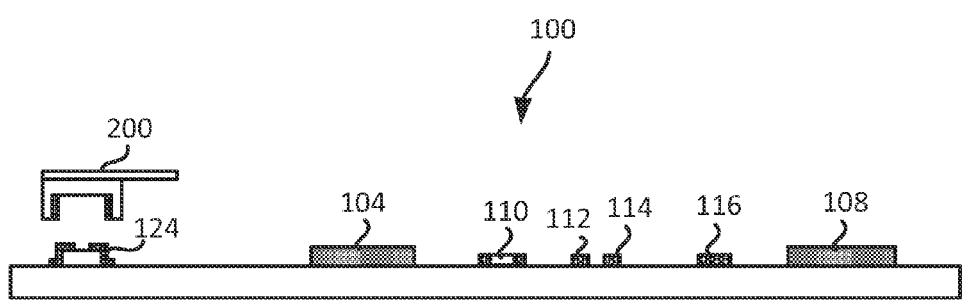
FIG. 2 illustrates a profile view of a conventional integrated device assembly.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to an integrated device package (e.g., die package) that includes a package substrate, a die (e.g., wafer level die), an encapsulation layer and a first set of metal layers. The package substrate includes a first surface and a second surface. The die (e.g., wafer level die) is coupled to the first surface of the package substrate. The encapsulation layer encapsulates the die. The first set of metal layers is coupled to a first exterior surface of the encapsulation layer. In some implementations, the first set of metal layers is configured to operate as a die-to-wire connector of the integrated device package. In some implementations, the integrated device package further includes a second set of metal layers coupled to the second surface of the package substrate. In some implementations, the integrated device package further includes a second set of metal layers coupled to a second exterior surface of the encapsulation layer, wherein the first exterior surface is a top surface of the encapsulation layer, and the second exterior surface is a side surface of the encapsulation layer. In some implementations, the integrated device package is coupled to a carrier (e.g., printed circuit board), and the second set of metal layers is configured to directly couple to the carrier. In some implementations, the first set of metal layers is configured to provide an electrical path for one of at least a power signal and/or a data signal to/from the integrated device package.

Some novel features pertain to a wire-to-die device that includes a casing, a wire casing, a set of wires, and a first set of metal layers. The casing includes a cavity that is configured to couple to an integrated device package. The wire casing is coupled to the casing. The set of wires is located in the wire casing. The first set of metal layers is coupled to the set of wires. The first set of metal layers is located in the casing, where the first set of metal layers is configured to couple to a second set of metal layers of the integrated device package. In some implementations, the first set of metal layers and the set of wires are configured to provide an electrical path for one of at least a power signal and/or a data signal to/from the integrated device package. In some implementations, the wire-to-die device further includes a shield layer located within the casing. In some implementations, the cavity forms a first interior surface and a second interior surface in the casing. The first set of metal layers is coupled to the first interior surface of the casing. In some implementations, the wire-to-die device further includes a third set of metal layers coupled to the set of wires, where the third set of metal layers is coupled to the second interior surface of the casing. In some implementations, the wire-to-die device further includes a first set of interconnects coupled to the first set of metal layers, and a first set of interfaces coupled to the set of wires and the first set of interconnects.

Figure 3:
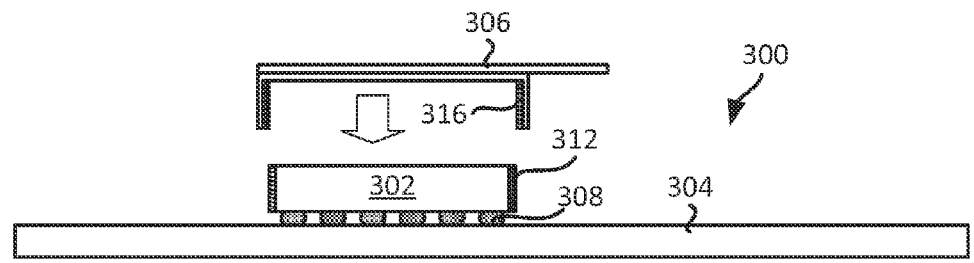
FIG. 3 illustrates a profile view of an integrated device assembly that includes a die package comprising connectors.

Exemplary Integrated Device Assembly Comprising Die Package Comprising Die-to-Wire Connector FIG. 3 conceptually illustrates an example of an integrated device assembly 300 that includes a die package 302, a carrier 304, and a connector header 306. The die package 302 is coupled to the carrier 304 through a set of solder balls 308 (e.g., ball grid array). However, the die package 302 may be coupled to the carrier 304 through other forms of interconnects (e.g., landing pad grid array). Different implementations may use different materials for the carrier 304. In some implementations, the carrier 304 is a printed circuit board (PCB). In some implementations, the carrier 304 is a substrate (e.g., laminated substrate).

FIG. 3 illustrates that the die package 302 includes a first set of connectors 312. Different implementations may use different die packages. Examples of die packages are further described in detail in FIGS. 21-22 and 26. In some implementations, the first set of connectors 312 are die-to-wire connectors. The first set of connectors 312 are located on the sides of the die package 302 (e.g., on an encapsulation portion of the die package). However, the first set of connectors 312 may be located on other portions of the die package 302. In some implementations, the first set of connectors 312 are metal layers coupled to the die package 302. The first set of connectors 312 are configured to provide an electrical path for a signal (e.g., power signal, data signal, or ground signal). In some implementations, the first set of connectors 312 are coupled to one or more solder balls 308. In the case that a landing pad array is used instead of solder balls, the first set of connectors 312 may be coupled to one or more landing pad.

FIG. 3 further illustrates a connector header 306. In some implementations, the connector header 306 is a wire-to-die connector device. The connector header 306 includes a second set of connectors 316. The second set of connectors 316 may include metal layers. The connector header 306 also includes a set of wires (which are not visible), which are coupled to the second set of connectors 316. In some implementations, the set of wires includes a set of cables. Examples of a set of wires are further described in FIGS. 8 and 9. In some implementations, the connector header 306 is configured to couple to a die package (e.g., die package 302). For example, the second set of connectors 316 of the connector header 306 may be configured to couple to the first set of connectors 312 of the die package 302. In some implementations, the connector header 306 is coupled to a power source (e.g., battery). In some implementations, the connector header 306 is configured to provide an electrical path from the power source to the die package 302. In some implementations, the connector header 306 is configured to provide an electrical path for data signal to/from the die package 302. In some implementations, the connector header 306 is configured to provide an electrical path for ground signal to/from the die package 302.

Different implementations may provide different electrical paths for a power signal (from the power source), a data signal, and/or ground signal to/from the die package 302.

In some implementations, a power signal from a power source and/or a data signal may traverse the wire of the connector header 306, the second set of connectors 316, the first set of connectors 312, at least a first solder ball from the set of solder balls 308 (or landing pad grid array), a first set of traces in the carrier 304, at least on capacitor coupled to the carrier 304, a second set of traces in the carrier 304, and/or at least a second solder ball from the set of solder balls 308 to reach the die package 302. In some implementations, a ground signal may traverse an identical path, a similar path or a different path.

In some implementations, a power signal from a power source and/or a data signal may traverse the wire of the connector header 306, the second set of connectors 316, the first set of connectors 312, and/or at least a first solder ball from the set of solder balls 308 (or landing pad grid array) to reach the die package 302. In some implementations, a ground signal may traverse an identical path, a similar path or a different path.

The integrated device assembly 300 of FIG. 3 provides several technical advantages over conventional integrated device assemblies. One, providing a wire-to-die connector header 306 that directly couples to a die package saves valuable space on the carrier 304, since the connector is implemented and/or integrated on the die package as opposed to being on the carrier 304. Second, providing the connectors on the die package 302 decreases the distance that a signal (e.g., power signal, data signal) has to travel to a die package, which can lead to improve and/or better signals to the die package, especially at low voltages. For example, in some implementations, the signal may bypass interconnects (e.g., traces, pads, vias) in the carrier (e.g., PCB). In some implementations, the signal may still traverse through some of the interconnects of the carrier, but the distance will be much less. Third, not having a separate connector that couples to a connector header reduces the cost and weight of the assembly 300. Fourth, not having a separate connector on the carrier 304 simplifies the design of interconnects (e.g., traces) in the carrier 304, since interconnects on the carrier 304 will not have to be designed around the connector.

Figure 4:
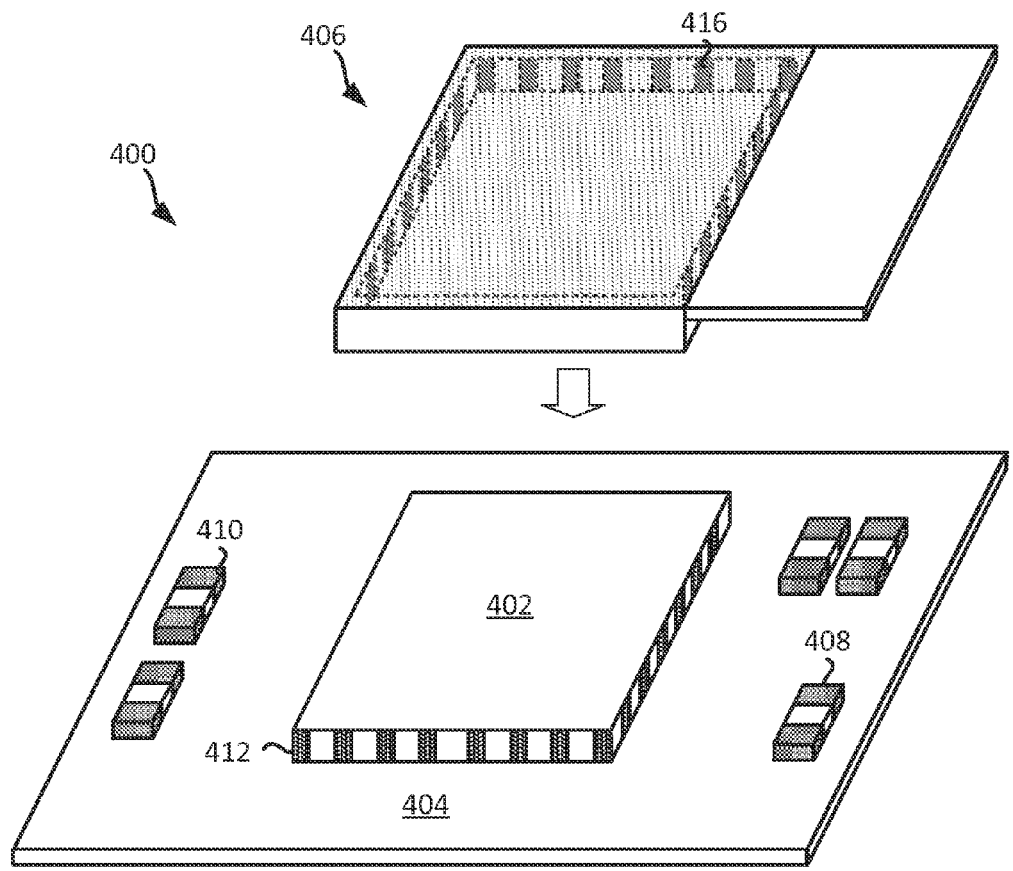
FIG. 4 illustrates an angled view of an integrated device assembly that includes a die package comprising connectors.

FIG. 4 conceptually illustrates an angled view of an example of an integrated device assembly 400 that includes a die package 402, a carrier 404, a connector header 406, a first capacitor 408, and a second capacitor 410. The die package 402 is coupled to the carrier 404 through a set of solder balls (not visible). However, the die package 402 may be coupled to the carrier 404 through other forms of interconnects (e.g., landing pad grid array). Different implementations may use different materials for the carrier 404. In some implementations, the carrier 404 is a printed circuit board (PCB). In some implementations, the carrier 404 is a substrate (e.g., laminated substrate).

FIG. 4 illustrates that the die package 402 includes a first set of connectors 412. Different implementations may use different die packages. Examples of die packages are further described in detail in FIGS. 21-22 and 26. In some implementations, the first set of connectors 412 are die-to-wire connectors. The first set of connectors 412 are located on the sides of the die package 402 (e.g., on an encapsulation portion of the die package). However, the first set of connectors 412 may be located on other portions of the die package 402. In some implementations, the first set of connectors 412 are metal layers coupled to the die package 402. The first set of connectors 412 are configured to provide an electrical path for a signal (e.g., power signal, data signal). In some implementations, the first set of connectors 412 are coupled to one or more solder balls (e.g., solder balls 308). In the case that a landing pad array is used instead of solder balls, the first set of connectors 412 may be coupled to one or more landing pad.

FIG. 4 further illustrates a connector header 406. In some implementations, the connector header 406 is a wire-to-die connector device. The connector header 406 includes a second set of connectors 416. The second set of connectors 416 may include metal layers. The connector header 406 also includes a set of wires (which are not visible), which are coupled to the second set of connectors 416. In some implementations, the set of wires includes a set of cables. Examples of a set of wires are further described in FIGS. 8 and 9. In some implementations, the connector header 406 is configured to couple to a die package (e.g., die package 402). For example, the second set of connectors 416 of the connector header 406 may be configured to couple to the first set of connectors 412 of the die package 402. In some implementations, the connector header 406 is coupled to a power source (e.g., battery). In some implementations, the connector header 406 is configured to provide an electrical path from the power source to the die package 402. In some implementations, the connector header 406 is configured to provide an electrical path for data signal to the die package 402. In some implementations, the connector header 406 is configured to provide an electrical path for a ground signal from the die package 402.

Different implementations may provide different electrical paths for a power signal (from the power source), a data signal to the die package 402, and/or a ground signal from the die package 402.

In some implementations, a power signal from a power source and/or a data signal may traverse the wire of the connector header 406, the second set of connectors 416, the first set of connectors 412, at least a first solder ball from the set of solder balls (or landing pad grid array), a first set of traces in the carrier 404, at least on capacitor (e.g., first capacitor 408) coupled to the carrier 404, a second set of traces in the carrier 404, and/or at least a second solder ball from the set of solder (e.g., solder balls 308) to reach the die package 402. In some implementations, a ground signal may traverse an identical path, a similar path or a different path.

In some implementations, a power signal from a power source and/or a data signal may traverse the wire of the connector header 406, the second set of connectors 416, the first set of connectors 412, and/or at least a first solder ball from the set of solder balls (or landing pad grid array) to reach the die package 402. In some implementations, a ground signal may traverse an identical path, a similar path or a different path.

Figure 5:
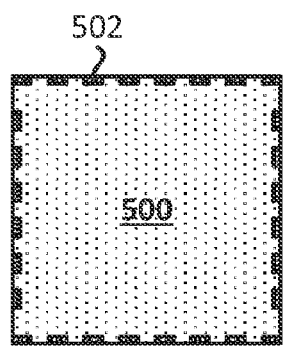
FIG. 5 illustrates a plan view of a die package comprising connectors.

FIG. 5 illustrates a plan view of a die package 500 that includes a first set of connectors 502. In some implementations, the die package 500 is a die package comprising a die-to-wire connector. In some implementations, the first set of connectors 502 are metal layers that are coupled to an encapsulation layer (e.g., mold) of the die package 500. In some implementations, the first set of connectors 502 are part of a die-to-wire connector of the die package 500.

FIG. 5 illustrates that the first set of connectors 502 are located on the side walls of the die package 500. FIG. 5 further illustrates that the first set of connectors 502 are embedded in the die package 500 (e.g., embedded in the encapsulation layer). In some implementations, the first set of connectors 502 may be on the surface of the die package 500 (e.g., on the surface of the encapsulation layer). Examples of die packages are further described in detail in FIGS. 21-22 and 26.

Figure 6:
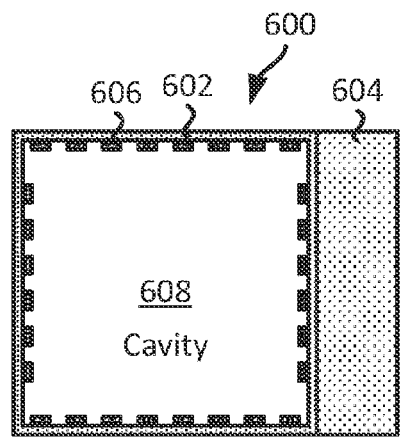
FIG. 6 illustrates a plan view of an inner cross section of a header connector configured to be coupled to a die package comprising connectors.

FIG. 6 illustrates a plan view of a connector header 600. Specifically, FIG. 6 illustrates an internal cross section plan view of the connector header 600. In some implementations, the connector header 600 is a wire-to-die connector. As shown in FIG. 6, the connector header 600 includes a casing 602, a wire casing 604, a second set of connectors 606. The casing 602 includes a cavity 608. The casing 602, the second set of connectors 606 and the cavity 608 are configured to couple to a die package that includes a set of connectors (e.g., die package 500). The second set of connectors 606 are coupled to a set of wires (which for the purpose of clarity are not shown) in the wire casing 604. In some implementations, the set of wires are configured to be coupled to a power source (e.g., battery) and/or a data signal source. Examples of wires in a wire casing are described in FIGS. 8-9.

Figure 7:
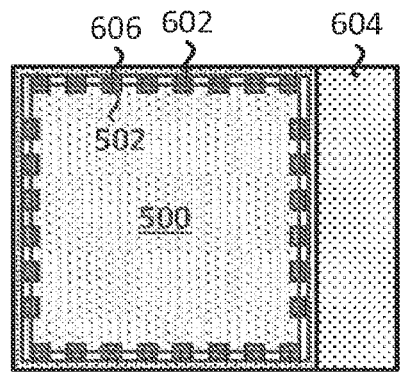
FIG. 7 illustrates a view of a die package comprising connectors coupled to a header connector.

FIG. 7 illustrates a plan view of a die package coupled to a connector header. As shown in FIG. 7, the die package 500 is coupled to the connector header 600. The die package 500 is coupled to the connector header 600 such that the first set of connectors 502 of the die package 500 is electrically coupled to the second set of connectors 606 of the connector header 600. FIG. 7 also illustrates that the die package 500 and the first set of connectors 502 are located within the cavity 608 of the casing 602 of the connector header 600. In some implementations, when the connector header 600 is coupled to the die package 500, the casing 602 encapsulates the die package 500.

Figure 8:
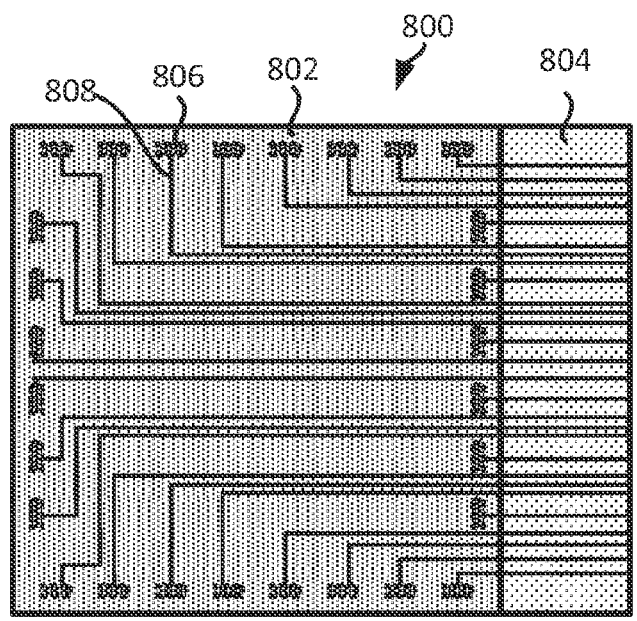
FIG. 8 illustrates a plan view of an inner cross section of a header connector configured to be coupled to a die package comprising connectors.

FIG. 8 illustrates a plan view of a connector header 800. Specifically, FIG. 8 illustrates an internal cross section plan view of the connector header 800. In some implementations, the connector header 800 is a wire-to-die connector device. As shown in FIG. 8, the connector header 800 includes a casing 802, a wire casing 804, a second set of connectors 806 and a set of wires 808. The casing 802 and the second set of connectors 806 are configured to couple to a die package that includes a set of connectors (e.g., die package 500). The second set of connectors 806 are coupled to the set of wires 808 in the wire casing 804. In some implementations, the set of wires 808 are configured to be coupled to a power source (e.g., battery) and/or a data signal source.

Figure 9:
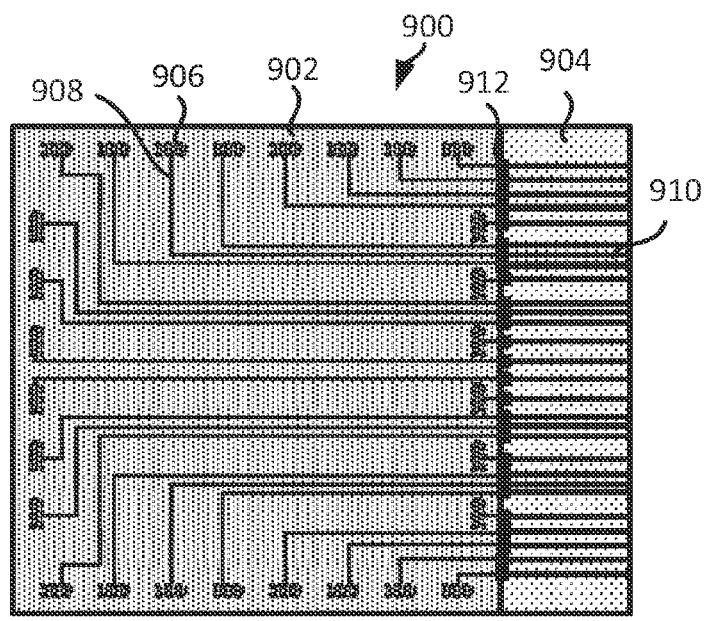
FIG. 9 illustrates a plan view of an inner cross section of another header connector configured to be coupled to a die package comprising connectors.

FIG. 9 illustrates a plan view of a connector header 900. Specifically, FIG. 9 illustrates an internal cross section plan view of the connector header 900. In some implementations, the connector header 900 is a wire-to-die connector device. As shown in FIG. 9, the connector header 900 includes a casing 902, a wire casing 904, a second set of connectors 906, a set of interconnects (e.g., traces) 908, and a set of wires 910. The casing 902 and the second set of connectors 906 are configured to couple to a die package that includes a set of connectors (e.g., die package 500). The second set of connectors 906 are coupled to set of interconnects 908 in the casing 902. The set of interconnects 908 are coupled to the set of wires 910 in the wire casing 904. In some implementations, the set of wires 910 has a bigger dimension than the set of interconnects 908. In some implementations, the set of wires 910 are coupled to the set of interconnects 908 through a set of interfaces 912. Different implementations may use different interfaces. In some implementations, the set of interfaces 912 may include one of at least a metal material, and/or bonding material capable of conducting an electrical signal. In some implementations, the set of interfaces 912 may include a structure that couples the set of interconnects 908 and the set of wires 910. The structure may include an electrically conductive material (e.g., metal), non-electrically conductive material (e.g., plastic), and/or a bonding material. In some implementations, the set of wires 910 are configured to be coupled to a power source (e.g., battery) and/or a data signal source.

Figure 10:
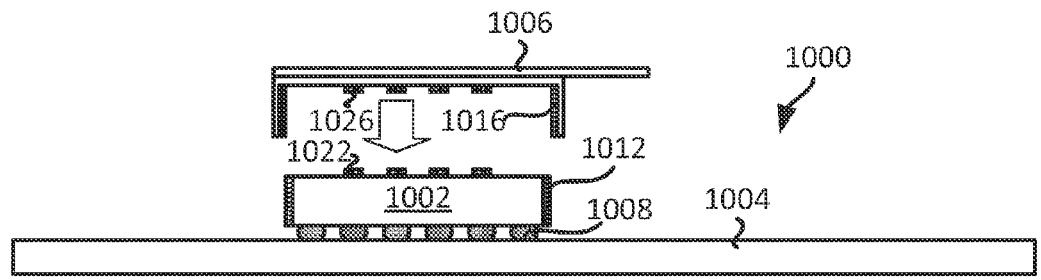
FIG. 10 illustrates a profile view of an integrated device assembly that includes a die package comprising connectors.

Exemplary Integrated Device Assembly Comprising Die Package Comprising Die-to-Wire Connector FIG. 10 conceptually illustrates an example of an integrated device assembly 1000 that includes a die package 1002, a carrier 1004, and a connector header 1006. The die package 1002 is coupled to the carrier 1004 through a set of solder balls 1008 (e.g., ball grid array). However, the die package 1002 may be coupled to the carrier 1004 through other forms of interconnects (e.g., landing pad grid array). Different implementations may use different materials for the carrier 1004. In some implementations, the carrier 1004 is a printed circuit board (PCB). In some implementations, the carrier 1004 is a substrate (e.g., laminated substrate).

FIG. 10 illustrates that the die package 1002 includes a first set of connectors 1012 and a second set of connectors 1022. Different implementations may use different die packages. Examples of die packages are further described in detail in FIGS. 21-22 and 26. In some implementations, the first set of connectors 1012 and the second set of connectors 1022 are die-to-wire connectors. The first set of connectors 1012 are located on the sides of the die package 1002 (e.g., on an encapsulation portion of the die package). However, the first set of connectors 1012 may be located on other portions of the die package 1002. The second set of connectors 1022 are located on a first surface (e.g., top surface) of the die package 1002 (e.g., on a top surface of an encapsulation portion of the die package 1002).

In some implementations, the first set of connectors 1012 and the second set of connectors 1022 are metal layers coupled to the die package 1002. The first set of connectors 1012 and the second set of connectors 1022 are configured to provide an electrical path for a signal (e.g., power signal, data signal). In some implementations, the first set of connectors 1012 are coupled to one or more solder balls 1008. In the case that a landing pad array is used instead of solder balls, the first set of connectors 1012 may be coupled to one or more landing pad. The second set of connectors 1022 are coupled to the first set of connectors 1012.

FIG. 10 further illustrates a connector header 1006. In some implementations, the connector header 1006 is a wire-to-die connector device. The connector header 1006 includes a third set of connectors 1016 and a fourth set of connectors 1026. The third set of connectors 1016 and the fourth set of connectors 1026 may include metal layers. The connector header 1006 also includes a set of wires (which for the purpose of clarity are not shown), which are coupled to the third set of connectors 1016 and/or the fourth set of connectors 1026. In some implementations, the set of wires includes a set of cables. Examples of a set of wires are further described in FIGS. 15 and 16. In some implementations, the connector header 1006 is configured to couple to a die package (e.g., die package 1002). For example, the third set of connectors 1016 of the connector header 1006 may be configured to couple to the first set of connectors 1012 of the die package 1002. Similarly, the fourth set of connectors 1026 of the connector header 1006 may be configured to couple to the second set of connectors 1022 of the die package 1002. In some implementations, the connector header 1006 is coupled to a power source (e.g., battery). In some implementations, the connector header 1006 is configured to provide an electrical path from the power source to the die package 1002. In some implementations, the connector header 1006 is configured to provide an electrical path for data signal to the die package 1002. In some implementations, the connector header 1006 is configured to provide an electrical path for a ground signal from the die package 1002.

Different implementations may provide different electrical paths for a power signal (from the power source), a data signal to the die package 1002, and/or a ground signal from the die package 1002.

In some implementations, a power signal from a power source and/or a data signal may traverse the wire of the connector header 1006, the third set of connectors, 1016, the fourth set of connectors 1026, the second set of connectors 1022, the first set of connectors 1012, at least a first solder ball from the set of solder balls 1008 (or landing pad grid array), a first set of traces in the carrier 1004, at least on capacitor coupled to the carrier 1004, a second set of traces in the carrier 1004, and/or at least a second solder ball from the set of solder balls 1008 to reach the die package 1002. In some implementations, a ground signal may traverse an identical path, a similar path or a different path.

In some implementations, a power signal from a power source and/or a data signal may traverse the wire of the connector header 1006, the third set of connectors 1016, the second set of connectors 1026, the second set of connectors 1022, the first set of connectors 1012, and/or at least a first solder ball from the set of solder balls 1008 (or landing pad grid array) to reach the die package 1002. In some implementations, a ground signal may traverse an identical path, a similar path or a different path.

The integrated device assembly 1000 of FIG. 10 provides several technical advantages over conventional integrated device assemblies. One, providing a wire-to-die connector header 1006 that directly couples to a die package saves valuable space on the carrier 1004, since the connector is implemented and/or integrated on the die package as opposed to being on the carrier 1004. Second, providing the connectors on the die package 1002 decreases the distance that a signal (e.g., power signal, data signal,) has to travel to a die package, which can lead to improve and/or better signals to the die package, especially at low voltages. For example, in some implementations, the signal may bypass interconnects (e.g., traces, pads, vias) in the carrier (e.g., PCB). In some implementations, the signal may still traverse through some of the interconnects of the carrier, but the distance will be much less. Third, not having a separate connector that couples to a connector header reduces the cost and weight of the assembly 1000. Fourth, not having a separate connector on the carrier 1004 simplifies the design of interconnects (e.g., traces) in the carrier 1004, since interconnects on the carrier 1004 will not have to be designed around the connector.

Figure 11:
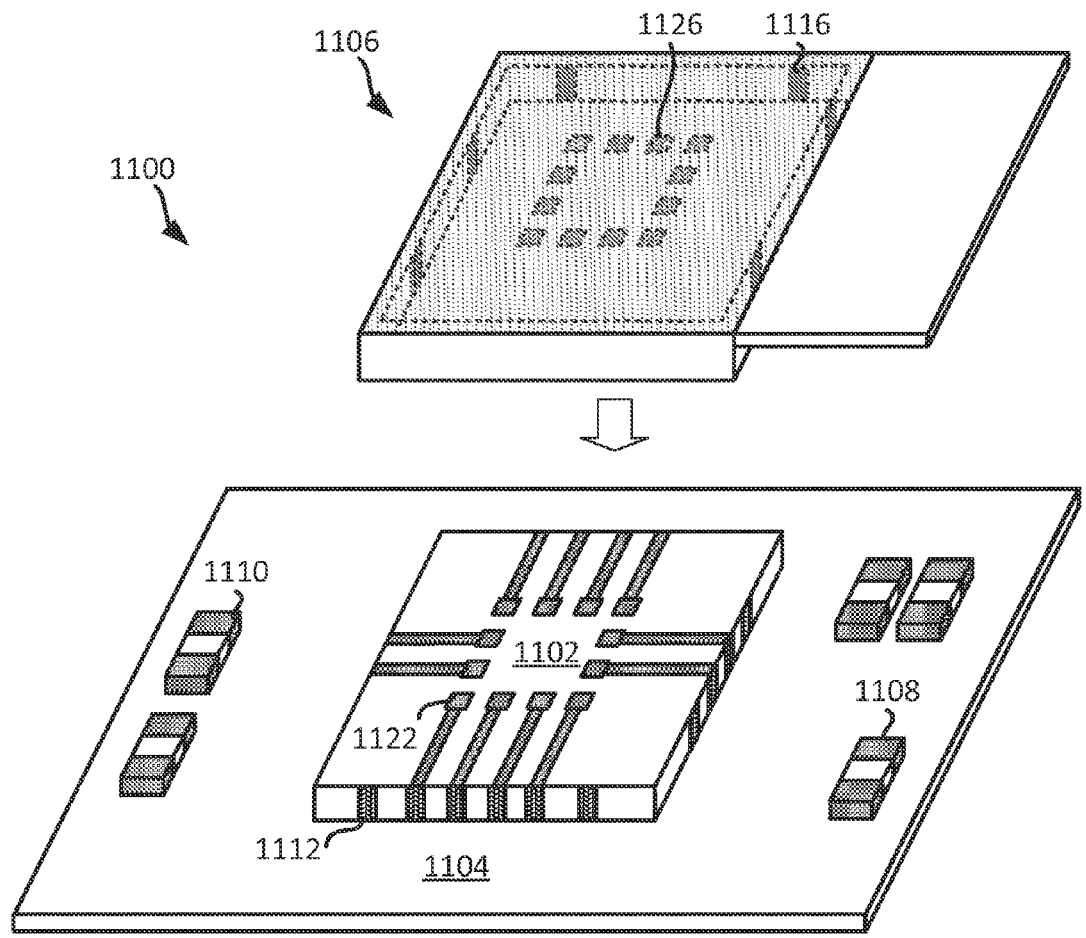
FIG. 11 illustrates an angled view of an integrated device assembly that includes a die package comprising connectors.

FIG. 11 conceptually illustrates an angled view of an example of an integrated device assembly 1100 that includes a die package 1102, a carrier 1104, a connector header 1106, a first capacitor 1108, and a second capacitor 1110. The die package 1102 is coupled to the carrier 1104 through a set of solder balls (not visible). However, the die package 1102 may be coupled to the carrier 1104 through other forms of interconnects (e.g., landing pad grid array). Different implementations may use different materials for the carrier 1104. In some implementations, the carrier 1104 is a printed circuit board (PCB). In some implementations, the carrier 1104 is a substrate (e.g., laminated substrate).

FIG. 11 illustrates that the die package 1102 includes a first set of connectors 1112 and a second set of connectors 1122. Different implementations may use different die packages. Examples of die packages are further described in detail in FIGS. 21-22 and 26. In some implementations, the first set of connectors 1112 and the second set of connectors 1122 are die-to-wire connectors. The first set of connectors 1112 are located on the sides of the die package 1102 (e.g., on an encapsulation portion of the die package). However, the first set of connectors 1112 may be located on other portions of the die package 1102. The second set of connectors 1122 are located on a surface (e.g., top surface) of the die package 1102 (e.g., on a top surface of encapsulation layer of the die package). In some implementations, the first set of connectors 1112 and the second set of connectors 1122 are metal layers coupled to the die package 1102.

The first set of connectors 1112 and the second set of connectors 1122 are configured to provide an electrical path for a signal (e.g., power signal, data signal). In some implementations, the first set of connectors 1112 are coupled to one or more solder balls (e.g., solder balls 1008). In the case that a landing pad array is used instead of solder balls, the first set of connectors 1112 may be coupled to one or more landing pad. In some implementations, the second set of connectors 1122 are coupled to the first set of connectors 1112.

FIG. 11 further illustrates a connector header 1106. In some implementations, the connector header 1106 is a wire-to-die connector device. The connector header 1106 includes a third set of connectors 1116 and a fourth set of connectors 1126. The third set of connectors 1116 and the fourth set of connectors 1126 may include metal layers. The connector header 1106 also includes a set of wires (which are not visible), which are coupled to the third set of connectors 1116 and/or the fourth set of connectors 1126. In some implementations, the set of wires includes a set of cables. Examples of a set of wires is further described in FIGS. 15 and 16. In some implementations, the connector header 1106 is configured to couple to a die package (e.g., die package 1102). For example, the third set of connectors 1116 of the connector header 1106 may be configured to couple to the first set of connectors 1112 of the die package 1102. Similarly, the fourth set of connectors 11126 of the connector header 1106 may be configured to couple to the second set of connectors 1122 of the die package 1102. In some implementations, the connector header 1106 is coupled to a power source (e.g., battery). In some implementations, the connector header 1106 is configured to provide an electrical path from the power source to the die package 1102. In some implementations, the connector header 1106 is configured to provide an electrical path for data signal to the die package 1102. In some implementations, the connector header 1106 is configured to provide an electrical path for a ground signal from the die package 1102.

Different implementations may provide different electrical paths for a power signal (from the power source), a data signal to the die package 1102 and/or a ground signal from the die package 1102.

In some implementations, a power signal from a power source and/or a data signal may traverse the wire of the connector header 1106, the third set of connectors, 1116, the fourth set of connectors 1126, the second set of connectors 1122, the first set of connectors 1112, at least a first solder ball (or landing pad), a first set of traces in the carrier 1104, at least on capacitor coupled to the carrier 1104, a second set of traces in the carrier 1104, and/or at least a second solder ball to reach the die package 1102.

In some implementations, a power signal from a power source and/or a data signal may traverse the wire of the connector header 1106, the third set of connectors 1116, the second set of connectors 1126, the second set of connectors 1122, the first set of connectors 1112, and/or at least a first solder ball (or landing pad) to reach the die package 1102.

Figure 12:
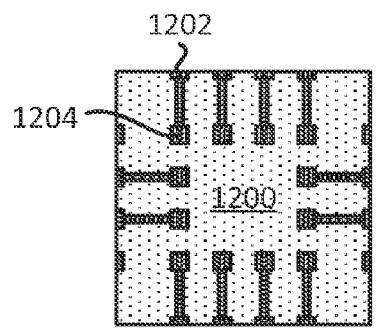
FIG. 12 illustrates a plan view of a die package comprising connectors.

FIG. 12 illustrates a plan view of a die package 1200 that includes a first set of connectors 1202 and a second set of connectors 1204. In some implementations, the die package 1200 is a die package comprising a die-to-wire connector. In some implementations, the first set of connectors 1202 and the second set of connectors 1204 are metal layers that are coupled to an encapsulation layer (e.g., mold) of the die package 1200. In some implementations, the first set of connectors 1202 and/or the second set of connectors 1204 are part of a die-to-wire connector of the die package 1200.

FIG. 12 illustrates that the first set of connectors 1202 are located on the side walls of the die package 1200, and the second set of connectors 1204 are located on a first surface (e.g., top surface) of the die package 1200. FIG. 12 further illustrates that the first set of connectors 1202 are embedded in the die package 1200 (e.g., embedded in the encapsulation layer). In some implementations, the first set of connectors 1202 may on the surface of the die package 1200 (e.g., on the surface of the encapsulation layer). Similarly, FIG. 12 illustrates that the second set of connectors 1204 are embedded in the die package 1200 (e.g., embedded in the encapsulation layer). In some implementations, the second set of connectors 1204 may on the surface of the die package 1200 (e.g., on the surface of the encapsulation layer). Examples of die packages are further described in detail in FIGS. 21-22 and 26.

Figure 13:
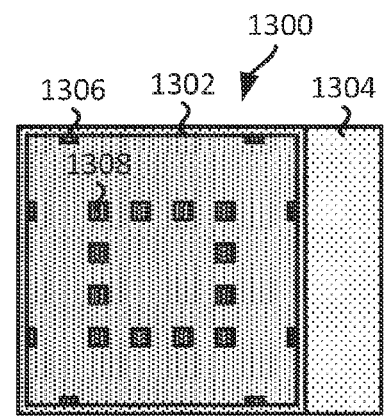
FIG. 13 illustrates a plan view of an inner cross section of a header connector configured to be coupled to a die package comprising connectors.

FIG. 13 illustrates a plan view of a connector header 1300. Specifically, FIG. 13 illustrates an internal cross section plan view of the connector header 1300. In some implementations, the connector header 1300 is a wire-to-die connector device. As shown in FIG. 13, the connector header 1300 includes a casing 1302, a wire casing 1304, a third set of connectors 1306, and a fourth set of connectors 1308. The casing 1302 includes a cavity. The casing 1302, the third set of connectors 1306, the fourth set of connectors 1308, and the cavity are configured to couple to a die package that includes a set of connectors (e.g., die package 1200). The third set of connectors 1306 and the fourth set of connectors 1308 are coupled to a set of wires (which for the purpose of clarity are not shown) in the wire casing 1304. In some implementations, the set of wires are configured to be coupled to a power source (e.g., battery) and/or a data signal source.

Figure 14:
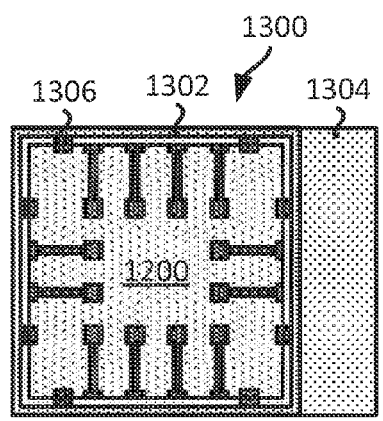
FIG. 14 illustrates a view of a die package comprising connectors coupled to a header connector.

FIG. 14 illustrates a plan view of a die package coupled to a connector header. As shown in FIG. 14, the die package 1200 is coupled to the connector header 1300. The die package 1200 is coupled to the connector header 1300 such that the first set of connectors 1202 of the die package 1200 is electrically coupled to the third set of connectors 1206 of the connector header 1300. Similarly, the die package 1200 is coupled to the connector header 1300 such that the second set of connectors 1204 of the die package 1200 is electrically coupled to the fourth set of connectors 1208 of the connector header 1300. FIG. 14 also illustrates that the die package 1200 and the first set of connectors 1202 are located within the cavity of the casing 1302 of the connector header 1300. In some implementations, when the connector header 1300 is coupled to the die package 1200, the casing 1302 encapsulates the die package 1200.

Figure 15:
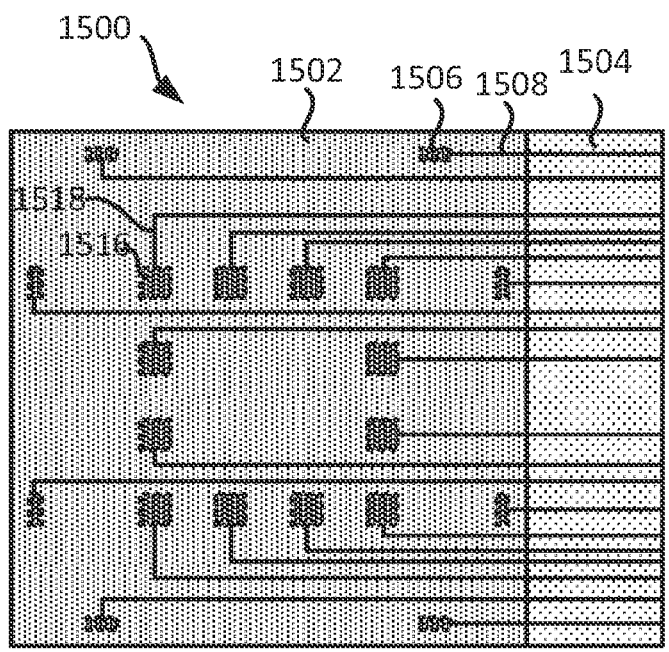
FIG. 15 illustrates a plan view of an inner cross section of a header connector configured to be coupled to a die package comprising connectors.

FIG. 15 illustrates a plan view of a connector header 1500. Specifically, FIG. 15 illustrates an internal cross section plan view of the connector header 1500. In some implementations, the connector header 1500 is a wire-to-die connector device. As shown in FIG. 15, the connector header 1500 includes a casing 1502, a wire casing 1504, a first set of connectors 1506, a first set of wires 1508, a second set of connectors 1516, and a second set of wires 1518. The casing 1502, the first set of connectors 1506 and the second set of connectors 1516 are configured to couple to a die package that includes a set of connectors (e.g., die package 1200). The first set of connectors 1506 are coupled to the first set of wires 1508 in the wire casing 1504. The second set of connectors 1516 are coupled to the second set of wires 1518 in the wire casing 1504. In some implementations, the first set of wires 1508 and the second set of wires 1518 are configured to be coupled to a power source (e.g., battery) and/or data signal source.

Figure 16:
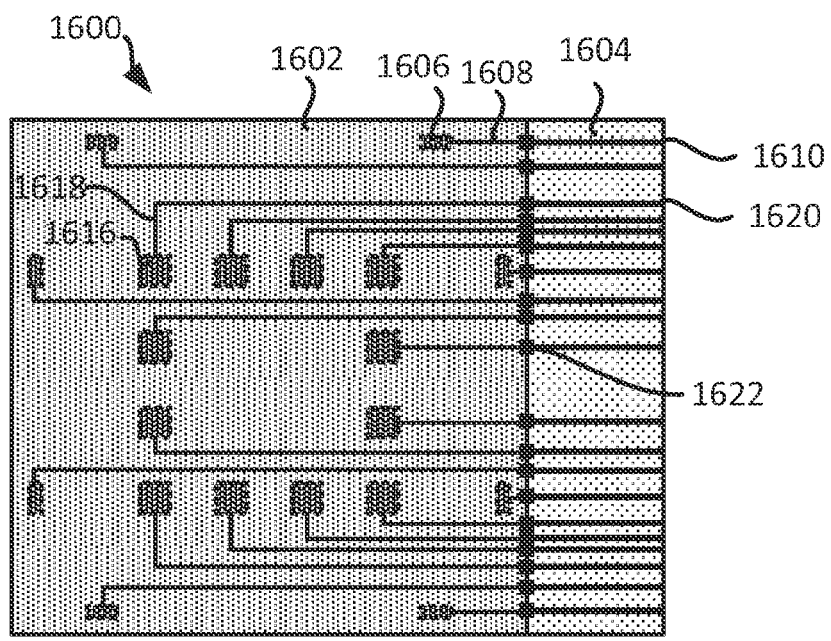
FIG. 16 illustrates a plan view of an inner cross section of another header connector configured to be coupled to a die package comprising connectors.

FIG. 16 illustrates a plan view of a connector header 1600. Specifically, FIG. 16 illustrates an internal cross section plan view of the connector header 1600. In some implementations, the connector header 1600 is a wire-to-die connector. As shown in FIG. 16, the connector header 1600 includes a casing 1602, a wire casing 1604, a first set of connectors 1606, a first set of interconnects (e.g., traces) 1608, a first set of wires 1610, a second set of connectors 1616, a second set of interconnects (e.g., traces) 1618, a second set of wires 1620. The casing 1602, the first set of connectors 1606, and the second set of connectors 1616 are configured to couple to a die package that includes a set of connectors (e.g., die package 1102). The first set of connectors 1606 are coupled to the first set of interconnects 1608 in the casing 1602. The second set of connectors 1616 are coupled to the second set of interconnects 1618 in the casing 1602. The first set of interconnects 1608 are coupled to the first set of wires 1610 in the wire casing 1604. The second set of interconnects 1618 are coupled to the second set of wires 1620 in the wire casing 1604. In some implementations, the first set of wires 1610 has a bigger dimension than the first set of interconnects 1608. In some implementations, the second set of wires 1620 has a bigger dimension than the second set of interconnects 1618. In some implementations, the first set of wires 1610 are coupled to the first set of interconnects 1608 through a set of interfaces 1622. In some implementations, the set of interfaces 1622 may includes one of at least a metal material, and/or bonding material capable of conducting an electrical signal. In some implementations, the set of interfaces 1622 may include a structure that couples the set of interconnects 1608 and the set of wires 1610. The structure may include an electrically conductive material (e.g., metal), non-electrically conductive material (e.g., plastic), and/or a bonding material. In some implementations, the second set of wires 1620 are coupled to the second set of interconnects 1618 through the set of interfaces 1622. In some implementations, the first and second sets of wires 1610 and 1620 are configured to be coupled to a power source (e.g., battery) and/or data signal source.

Figure 17:
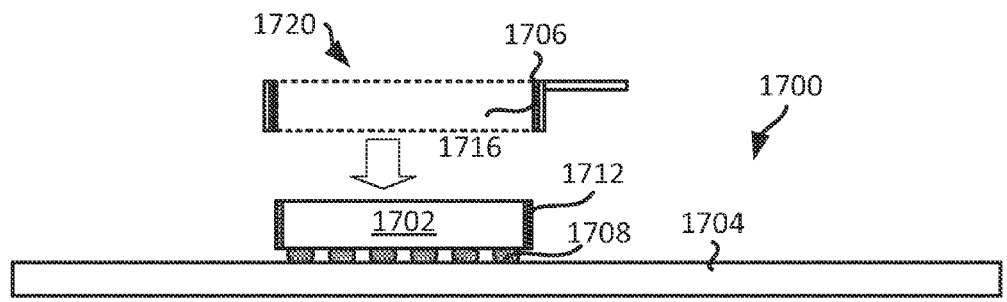
FIG. 17 illustrates a profile view of an integrated device assembly that includes a die package comprising connectors.

Exemplary Integrated Device Assembly Comprising Die Package Comprising Die-to-Wire Connector FIG. 17 conceptually illustrates an example of an integrated device assembly 1700 that includes a die package 1702, a carrier 1704, and a connector header 1706. The die package 1702 is coupled to the carrier 1704 through a set of solder balls 1708 (e.g., ball grid array). However, the die package 1702 may be coupled to the carrier 1704 through other forms of interconnects (e.g., landing pad grid array). Different implementations may use different materials for the carrier 1704. In some implementations, the carrier 1704 is a printed circuit board (PCB). In some implementations, the carrier 1704 is a substrate (e.g., laminated substrate).

FIG. 17 illustrates that the die package 1702 includes a first set of connectors 1712. Different implementations may use different die packages. Examples of die packages are further described in detail in FIGS. 21-22. In some implementations, the first set of connectors 1712 are die-to-wire connectors. The first set of connectors 1712 are located on the sides of the die package 1702 (e.g., on an encapsulation portion of the die package). However, the first set of connectors 1712 may be located on other portions of the die package 1702. In some implementations, the first set of connectors 1712 are metal layers coupled to the die package 1702. The first set of connectors 1712 are configured to provide an electrical path for a signal (e.g., power signal, data signal). In some implementations, the first set of connectors 1712 are coupled to one or more solder balls 1708. In the case that a landing pad array is used instead of solder balls, the first set of connectors 1712 may be coupled to one or more landing pad.

FIG. 17 further illustrates a connector header 1706. In some implementations, the connector header 1706 is a wire-to-die connector device. The connector header 1706 includes a cavity 1720 that traverses the connector header 1706. In some implementations, the cavity 1720 is configured to couple to the die package 1702. In some implementations, when the connector header 1706 is coupled to the die package 1702, a portion (e.g., top surface of the encapsulation layer) of the die package 1702 is exposed. Thus, in some implementations, when the connector header 1706 is coupled to the die package 1702, the connector header 1706 is coupled to the side walls of the die package 1702. One advantage of this configuration of the connector header 1706 is that it provides a low profile connector, thereby providing a low profile integrated device assembly.

The connector header 1706 includes a second set of connectors 1716. The second set of connectors 1716 may include metal layers. The connector header 1706 also includes a set of wires (which for the purpose of clarity are not shown), which are coupled to the second set of connectors 1716. In some implementations, the set of wires includes a set of cables. In some implementations, the connector header 1706 is configured to couple to a die package (e.g., die package 1702). For example, the second set of connectors 1716 of the connector header 1706 may be configured to couple to the first set of connectors 1712 of the die package 1702. In some implementations, the connector header 1706 is coupled to a power source (e.g., battery). In some implementations, the connector header 1706 is configured to provide an electrical path from the power source to the die package 1702. In some implementations, the connector header 1706 is configured to provide an electrical path for data signal to the die package 1702. In some implementations, the connector header 1706 is configured to provide an electrical path for a ground signal from the die package 1702.

Different implementations may provide different electrical paths for a power signal (from the power source), a data signal to the die package 1702, and/or a ground signal from the die package 1702.

In some implementations, a power signal from a power source and/or a data signal may traverse the wire of the connector header 1706, the second set of connectors 1716, the first set of connectors 1712, at least a first solder ball from the set of solder balls 1708 (or landing pad grid array), a first set of traces in the carrier 1704, at least on capacitor coupled to the carrier 1704, a second set of traces in the carrier 1704, and/or at least a second solder ball from the set of solder balls 1708 to reach the die package 1702. In some implementations, a ground signal may traverse an identical path, a similar path or a different path.

In some implementations, a power signal from a power source and/or data signal may traverse the wire of the connector header 1706, the second set of connectors 1716, the first set of connectors 1712, and/or at least a first solder ball from the set of solder balls 1708 (or landing pad grid array) to reach the die package 1702. In some implementations, a ground signal may traverse an identical path, a similar path or a different path.

The integrated device assembly 1700 of FIG. 17 provides several technical advantages over conventional integrated device assemblies. One, providing a wire-to-die connector header 1706 that directly couples to a die package saves valuable space on the carrier 1704, since the connector is implemented and/or integrated on the die package as opposed to being on the carrier 1704. Second, providing the connectors on the die package 1702 decreases the distance that a signal (e.g., power signal, data signal) has to travel to a die package, which can lead to improve and/or better signals to the die package, especially at low voltages. For example, in some implementations, the signal may bypass interconnects (e.g., traces, pads, vias) in the carrier (e.g., PCB). In some implementations, the signal may still traverse through some of the interconnects of the carrier, but the distance will be much less. Third, not having a separate connector that couples to a connector header reduces the cost and weight of the assembly 1700. Fourth, not having a separate connector on the carrier 1704 simplifies the design of interconnects (e.g., traces) in the carrier 1704, since interconnects on the carrier 1704 will not have to be designed around the connector.

Figure 18:
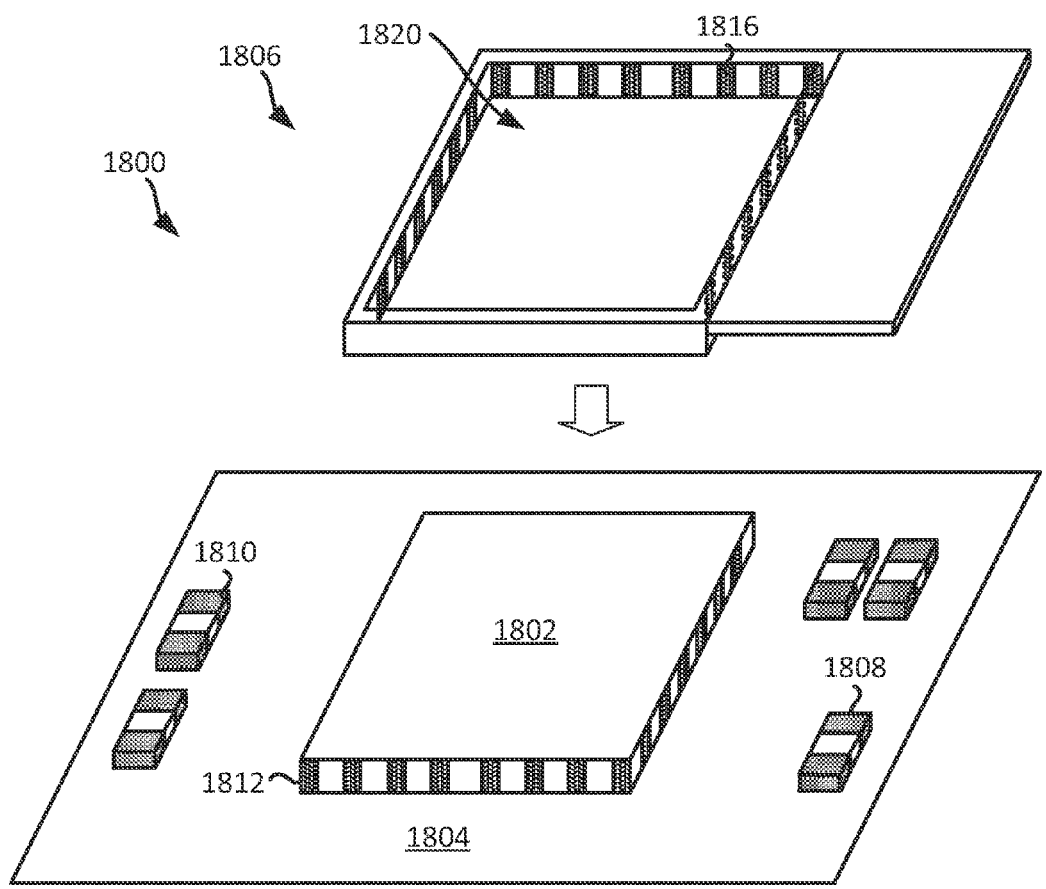
FIG. 18 illustrates an angled view of an integrated device assembly that includes a die package comprising connectors.

FIG. 18 conceptually illustrates an angled view of an example of an integrated device assembly 1800 that includes a die package 1802, a carrier 1804, a connector header 1806, a first capacitor 1808, and a second capacitor 1810. The die package 1802 is coupled to the carrier 1804 through a set of solder balls (not visible). However, the die package 1802 may be coupled to the carrier 1804 through other forms of interconnects (e.g., landing pad grid array). Different implementations may use different materials for the carrier 1804. In some implementations, the carrier 1804 is a printed circuit board (PCB). In some implementations, the carrier 1804 is a substrate (e.g., laminated substrate).

FIG. 18 illustrates that the die package 1802 includes a first set of connectors 1812. Different implementations may use different die packages. Examples of die packages are further described in detail in FIGS. 21-22 and 26. In some implementations, the first set of connectors 1812 are die-to-wire connectors. The first set of connectors 1812 are located on the sides of the die package 1802 (e.g., on an encapsulation portion of the die package). However, the first set of connectors 1812 may be located on other portions of the die package 1802. In some implementations, the first set of connectors 1812 are metal layers coupled to the die package 1802. The first set of connectors 1812 are configured to provide an electrical path for a signal (e.g., power signal, data signal). In some implementations, the first set of connectors 1812 are coupled to one or more solder balls (e.g., solder balls 1708). In the case that a landing pad array is used instead of solder balls, the first set of connectors 1812 may be coupled to one or more landing pad.

FIG. 18 further illustrates a connector header 1806. In some implementations, the connector header 1806 is a wire-to-die connector device. The connector header 1806 includes a cavity 1820 that traverses the connector header 1806. In some implementations, the cavity 1820 is configured to couple to the die package 1802. In some implementations, when the connector header 1806 is coupled to the die package 1802, a portion (e.g., top surface of the encapsulation layer) of the die package 1802 is exposed. Thus, in some implementations, when the connector header 1806 is coupled to the die package 1802, the connector header 1806 is coupled to the side walls of the die package 1802. One advantage of this configuration of the connector header 1806 is that it provides a low profile connector, thereby providing a low profile integrated device assembly.

The connector header 1806 includes a second set of connectors 1816. The second set of connectors 1816 may include metal layers. The connector header 1806 also includes a set of wires (which are not visible), which are coupled to the second set of connectors 1816. In some implementations, the set of wires includes a set of cables. Examples of a set of wires were described in FIGS. 8 and 9. In some implementations, the connector header 1806 is configured to couple to a die package (e.g., die package 1802). For example, the second set of connectors 1816 of the connector header 1806 may be configured to couple to the first set of connectors 1812 of the die package 1802. In some implementations, the connector header 1806 is coupled to a power source (e.g., battery). In some implementations, the connector header 1806 is configured to provide an electrical path from the power source to the die package 1802. In some implementations, the connector header 1806 is configured to provide an electrical path for data signal to the die package 1802. In some implementations, the connector header 1806 is configured to provide an electrical path for a ground signal from the die package 1802.

Different implementations may provide different electrical paths for a power signal (from the power source), a data signal to the die package 1802, and/or a ground signal from the die package 1802.

In some implementations, a power signal from a power source and/or a data signal may traverse the wire of the connector header 1806, the second set of connectors 1816, the first set of connectors 1812, at least a first solder ball from the set of solder balls (or landing pad grid array), a first set of traces in the carrier 1804, at least on capacitor (e.g., first capacitor 1808) coupled to the carrier 1804, a second set of traces in the carrier 1804, and/or at least a second solder ball from the set of solder (e.g., solder balls 1708) to reach the die package 1802. In some implementations, a ground signal may traverse an identical path, a similar path or a different path.

In some implementations, a power signal from a power source and/or a data signal may traverse the wire of the connector header 1806, the second set of connectors 1816, the first set of connectors 1812, and/or at least a first solder ball from the set of solder balls (or landing pad grid array) to reach the die package 1802. In some implementations, a ground signal may traverse an identical path, a similar path or a different path.

Exemplary Wire-to-Die Connector Comprising Shielding

Figure 19:
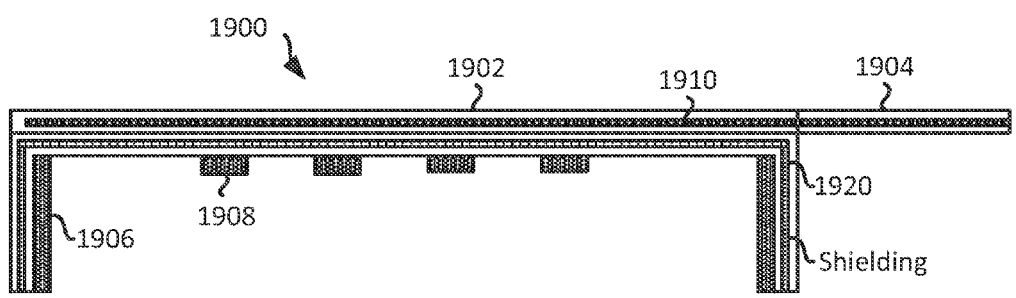
FIG. 19 illustrates a profile view of a connector header that includes a shield layer.

FIG. 19 illustrates a profile view of a connector header 1900. Specifically, FIG. 19 illustrates an internal cross section plan view of the connector header 1900 that includes shielding. In some implementations, the connector header 1900 is a wire-to-die connector device. As shown in FIG. 19, the connector header 1900 includes a casing 1902, a wire casing 1904, a first set of connectors 1906, a second set of connectors 1908, a set of wires 1910, and a shield layer 1920. The casing 1902, the first set of connectors 1906 and the second set of connectors 1908 are configured to couple to a die package that includes a set of connectors (e.g., die package 1200). The first set of connectors 1906 and the second set of connectors 1908 are coupled to the set of wires 1910 in the wire casing 1904. In some implementations, the set of wires 1910 are configured to be coupled to a power source (e.g., battery) and/or a data signal source.

The casing 1904 includes a shield layer 1920. Different implementations may use different materials for the shield layer 1920. In some implementations, the shield layer 1920 provides electrical, magnetic, and/or electromagnetic interference (EMI) shielding.

Figure 20:
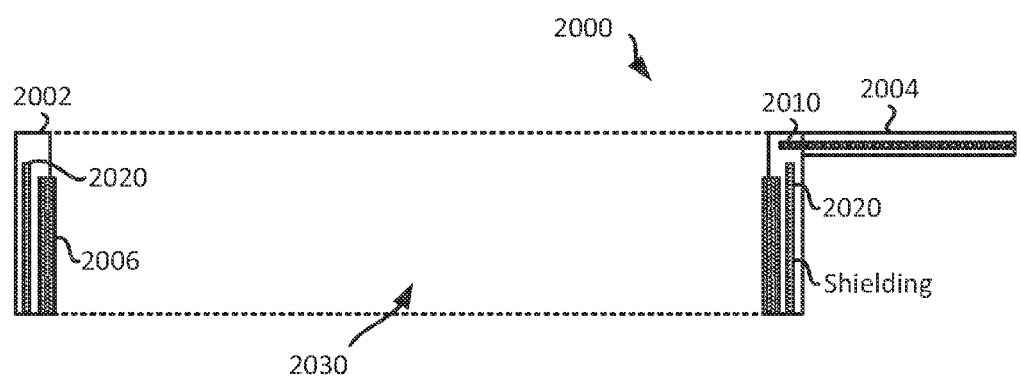
FIG. 20 illustrates a profile view of another connector header that includes a shield layer.

FIG. 20 illustrates a profile view of a connector header 2000. Specifically, FIG. 20 illustrates an internal cross section plan view of the connector header 2000 that includes shielding. In some implementations, the connector header 2000 is a wire-to-die connector device. As shown in FIG. 20, the connector header 2000 includes a casing 2002, a wire casing 2004, a first set of connectors 2006, a set of wires 2010, a shield layer 2020 and a cavity 2030. The cavity 2030 traverses the casing 2002. The casing 2002, the first set of connectors 2006, and the cavity 2030 are configured to couple to a die package that includes a set of connectors (e.g., die package 1200). The first set of connectors 2006 are coupled to the set of wires 2010 in the wire casing 2004. In some implementations, the set of wires 2010 are configured to be coupled to a power source (e.g., battery) and/or data signal source. The casing 2004 includes a shield layer 2020. Different implementations may use different materials for the shield layer 2020.

Exemplary Die Package Comprising Die-to-Wire Connector

Figure 21:
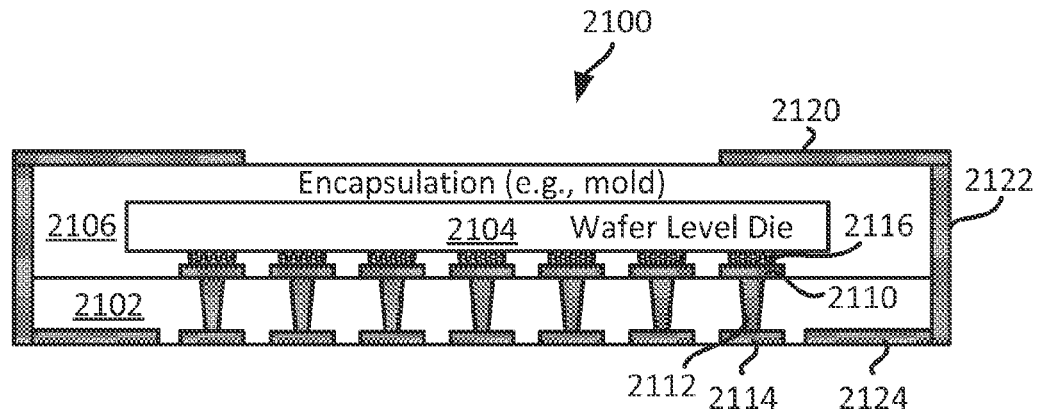
FIG. 21 illustrates a profile view of a die package that includes a die-to-wire connector.

FIG. 21 illustrates an example of a die package 2100 that includes a die-to-wire connector. As shown in FIG. 21, the die package 2100 includes a package substrate 2102, a wafer level die 2104, and an encapsulation layer 2106. The package substrate 2102 includes a first pad 2110, a via 2112, and a second pad 2114. The first pad 2110 is on a first surface of the package substrate 2102. The via 2112 traverses the package substrate 2102. The second pad 2114 is embedded in a second surface of the package substrate 2102. The first pad 2110 is coupled the via 2112. The via 2112 is coupled to the second pad 2114. In some implementations, the second pad 2114 is part of a landing pad grid array (LGA). It should be noted that the package substrate 2102 may include several metal layers (e.g., M1, M2) and several vias coupling the several metal layers.

The wafer level die 2104 is coupled to the package substrate 2102. Specifically, the wafer level die 2104 is coupled to the first pad 2110 of the package substrate 2102. In particular, the wafer level die 2104 is coupled to the first pad 2110 through a first solder ball 2116. In some implementations, the first solder ball 2116 may be replaced with other forms of interconnects, such as pillars (e.g., copper pillar). Thus, the wafer level die 2104 may be coupled to the first pad 2110 through other forms of interconnects and is therefore not limited to the first solder ball 2116 shown in FIG. 21.

FIG. 21 also illustrates that the encapsulation layer 2106 encapsulates the wafer level die 2104. Different implementations may use different materials for the encapsulation layer 2106. In some implementations, the encapsulation layer 2106 includes one of at least a mold, a polymer, and/or a fill.

FIG. 21 further illustrates a first set of interconnects 2120, a second set of interconnects 2122, and a third set of interconnects 2124. The first set of interconnects 2120, the second set of interconnects 2122, and the third set of interconnects 2124 are configured to operate as a die-to-wire connector for the die package 2100. The first set of interconnects 2120 is coupled to the second set of interconnects 2122. The second set of interconnects 2122 is coupled to the third set of interconnects 2124.

The first set of interconnects 2120 is located on a first surface (e.g., top surface) of the encapsulation layer 2106. In some implementations, the first set of interconnects 2120 is embedded in the first surface of the encapsulation layer 2106.

The second set of interconnects 2122 is located on a second surface (e.g., side surface) of the encapsulation layer 2106 and/or a side surface of the package substrate 2102. In some implementations, the second set of interconnects 2122 is embedded in the second surface of the encapsulation layer 2106 and/or the side surface of the package substrate 2102.

The third set of interconnects 2124 is located on the second side (e.g., bottom surface) of the package substrate 2102. In some implementations, the third set of interconnects 2124 is embedded in the second side of the package substrate 2102. In some implementations, the third set of interconnects 2124 is configured as a pad for a landing pad grid array (LGA).

Different implementations may provide different electrical paths between the first set of interconnects 2120 and the wafer level die 2104. In some implementations, an electrical path between the first set of interconnects 2120 and the wafer level die 2104 includes one of at least the second set of interconnects 2122, the third set of interconnects 2124, interconnects (e.g., traces, vias) in the package substrate 2102, the first pads 2110, and/or the solder balls 2116.

FIG. 21 illustrates the die package 2100 has having one wafer level die. However, in some implementations, the die package 2100 may include two or more wafer level dies.

Figure 22:
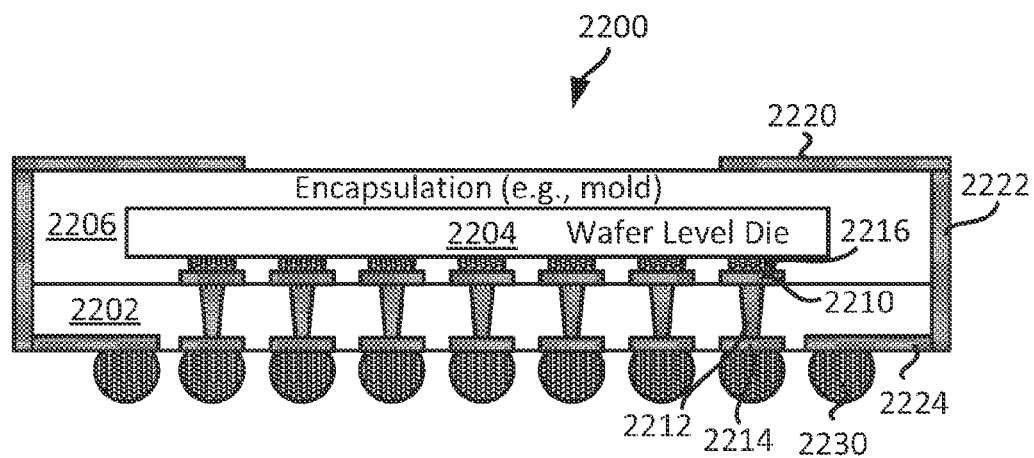
FIG. 22 illustrates a profile view of another die package that includes a die-to-wire connector.

FIG. 22 illustrates another example of a die package 2200 that includes a die-to-wire connector. As shown in FIG. 22, the die package 2200 includes a package substrate 2202, a wafer level die 2204, and an encapsulation layer 2206. The package substrate 2202 includes a first pad 2210, a via 2212, and a second pad 2214. The first pad 2210 is on a first surface of the package substrate 2202. The via 2212 traverses the package substrate 2202. The second pad 2214 is embedded in a second surface of the package substrate 2202. The first pad 2210 is coupled the via 2212. The via 2212 is coupled to the second pad 2214. It should be noted that the package substrate 2202 may include several metal layers (e.g., M1, M2) and several vias coupling the several metal layers.

The wafer level die 2204 is coupled to the package substrate 2202. Specifically, the wafer level die 2204 is coupled to the first pad 2210 of the package substrate 2202. In particular, the wafer level die 2204 is coupled to the first pad 2210 through a first solder ball 2216. In some implementations, the first solder ball 2216 may be used or replaced with other forms of interconnects, such as pillars (e.g., copper pillar). Thus, the wafer level die 2204 may be coupled to the first pad 2210 through other forms of interconnects and is therefore not limited to the first solder ball 2216 shown in FIG. 22.

FIG. 22 also illustrates that the encapsulation layer 2206 encapsulates the wafer level die 2204. Different implementations may use different materials for the encapsulation layer 2206. In some implementations, the encapsulation layer 2206 includes one of at least a mold, a polymer, and/or a fill.

FIG. 22 further illustrates a first set of interconnects 2220, a second set of interconnects 2222, and a third set of interconnects 2224. The first set of interconnects 2220, the second set of interconnects 2222, and the third set of interconnects 2224 are configured to operate as a die-to-wire connector for the die package 2200. The first set of interconnects 2220 is coupled to the second set of interconnects 2222. The second set of interconnects 2222 is coupled to the third set of interconnects 2224.

The first set of interconnects 2220 is located on a first surface (e.g., top surface) of the encapsulation layer 2206. In some implementations, the first set of interconnects 2220 is embedded in the first surface of the encapsulation layer 2206.

The second set of interconnects 2222 is located on a second surface (e.g., side surface) of the encapsulation layer 2206 and/or a side surface of the package substrate 2202. In some implementations, the second set of interconnects 2222 is embedded in the second surface of the encapsulation layer 2206 and/or the side surface of the package substrate 2202.

The third set of interconnects 2224 is located on the second side (e.g., bottom surface) of the package substrate 2202. In some implementations, the third set of interconnects 2224 is embedded in the second side of the package substrate 2202. A second solder ball 2230 (which may be part of a ball grid array) is coupled to the third set of interconnects 2224.

Different implementations may provide different electrical paths between the first set of interconnects 2220 and the wafer level die 2204. In some implementations, an electrical path between the first set of interconnects 2220 and the wafer level die 2204 includes one of at least the second set of interconnects 2222, the third set of interconnects 2224, the solder ball 2230, the second pad 2214, the via 2212, the first pads 2210, and/or the solder balls 2216. In some implementations, an electrical path between the first set of interconnects 2220 and the wafer level die 2204 includes one of at least the second set of interconnects 2222, the third set of interconnects 2224, the solder ball 2230, at least one interconnect outside of the die package 2200, the second pad 2214, the via 2212, the first pads 2210, and/or the solder balls 2216.

FIG. 22 illustrates the die package 2200 has having one wafer level die. However, in some implementations, the die package 2200 may include two or more wafer level dies.

Figure 23:
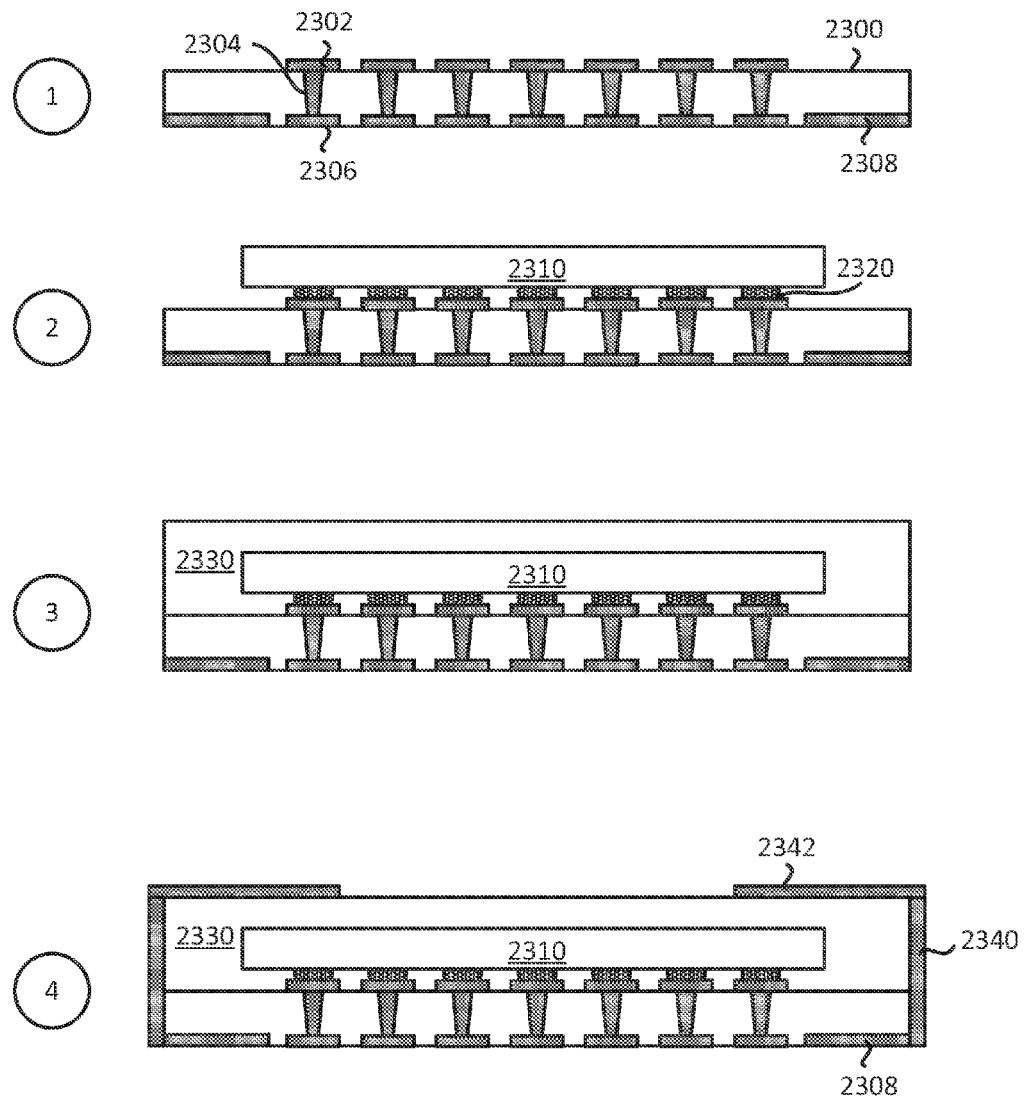
FIG. 23 illustrates a sequence for providing a die package that includes a die-to-wire connector.

Exemplary Sequence for Fabricating a Die Package Comprising Die-to-Wire Connector In some implementations, providing (e.g., fabricating) a die package that includes a die-to-wire connector includes several processes. FIG. 23 illustrates an exemplary sequence for providing a die package that includes a die-to-wire connector. In some implementations, the sequence of FIG. 23 may be used to provide/fabricate the die package of FIGS. 21 and/or 22, and/or other die package described in the present disclose.

It should be noted that the sequence of FIG. 23 may combine one or more stages in order to simplify and/or clarify the sequence for providing a die package.

Stage 1 of FIG. 23 illustrates a package substrate 2300 after it is provided (e.g., formed). In some implementations, providing the package substrate 2300 may include receiving a package substrate from a supplier or fabricating a package substrate. The package substrate 2300 includes a first pad 2302, a via 2304, a second pad 2306, and a first set of interconnects 2308. The first pad 2302 is coupled to the via 2304. The via 2304 is coupled to the second pad 2306.

Stage 2 illustrates a wafer level die 2310 after the wafer level die 2310 is coupled to the package substrate 2300. As shown at stage 2, the wafer level die 2310 is coupled to the package substrate 2300 through a set of solder balls 2320. Specifically, the wafer level die 2310 is coupled to the first pad 2302 through the set of solder balls 2320. In some implementations, the set of solder balls 2320 may be used or replaced with other forms of interconnects, such as pillars (e.g., copper pillar). Thus, the wafer level die 2310 may be coupled to the first pad 2302 through other forms of interconnects and is therefore not limited to the set of solder balls 2320 shown in FIG. 21.

Stage 3 illustrates an encapsulation layer 2330 encapsulating the wafer level die 2310, which forms a die package. Different implementations may use different materials for the encapsulation layer 2330. In some implementations, the encapsulation layer 2330 includes one of at least a mold, a polymer, and/or a fill.

Stage 4 illustrates a second set of interconnects 2340 and a third set of interconnects 2342 on the die package. Specifically, the second set of interconnects 2340 is coupled to a side of the encapsulation layer 2330 and/or the side of the package substrate 2300. The third set of interconnects 2342 is coupled to a first surface (e.g., top surface) of the encapsulation layer 2330. Stage 4 illustrates that the first set of interconnects 2308 is coupled to the second set of interconnects 2340. The second set of interconnects 2340 is coupled to the third set of interconnects 2342. In some implementations, the first set of interconnects 2308, the second set of interconnects 2340, and/or the third set of interconnects 2342 form a set of connectors for a die-to-wire connector of a die package.

Exemplary Method for Fabricating a Die Package Comprising Die-to-Wire Connector

In some implementations, providing (e.g., fabricating) a die package that includes a die-to-wire connector includes several processes. FIG. 24 illustrates an exemplary flow diagram of a method for providing a die package that includes a die-to-wire connector. In some implementations, the flow diagram of FIG. 24 may be used to provide/fabricate the die package of FIGS. 21 and/or 22, and/or other die package described in the present disclose.

It should be noted that the sequence of FIG. 24 may combine one or more stages in order to simplify and/or clarify the method for fabricate a die package.

The method provides (at 2405) a package substrate. In some implementations, providing the package substrate may include receiving a package substrate from a supplier or fabricating (e.g., form) a package substrate. The package substrate may include a first pad, a via, a second pad, and a first set of interconnects.

The method provides (at 2410) a wafer level die on the packages substrate. In some implementations, providing the wafer level die includes coupling the wafer level die to the package substrate through a set of solder balls.

The method then provides (at 2415) an encapsulation layer. In some implementations, providing the encapsulation layer includes forming an encapsulation layer that encapsulates the wafer level die, which forms a die package. Different implementations may use different materials for the encapsulation layer. In some implementations, the encapsulation layer includes one of at least a mold, a polymer, and/or a fill.

The method also provides (at 2420) at least one connector. In some implementations, providing at least one connector includes forming a second set of interconnects and a third set of interconnects on the die package. Specifically, the second set of interconnects is coupled to a side of the encapsulation layer and/or the side of the package substrate. In some implementations, the third set of interconnects formed on a first surface (e.g., top surface) of the encapsulation layer. The first set of interconnects is coupled to the second set of interconnects. The second set of interconnects is coupled to the third set of interconnects. In some implementations, the first set of interconnects, the second set of interconnects, and/or the third set of interconnects form a set of connectors for a die-to-wire connector of a die package.

Figure 25:
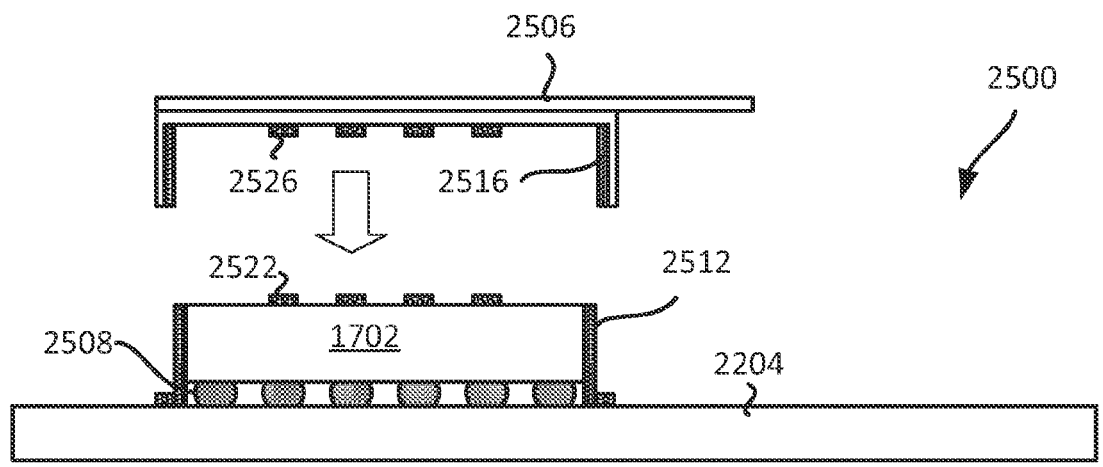
FIG. 25 illustrates a profile view of an integrated device assembly that includes a die package comprising connectors.

Exemplary Integrated Device Assembly Comprising Die Package Comprising Die-to-Wire Connector FIG. 25 conceptually illustrates an example of an integrated device assembly 2500 that includes a die package 2502, a carrier 2504, and a connector header 2506. The die package 2502 is coupled to the carrier 2504 through a set of solder balls 2508 (e.g., ball grid array). However, the die package 2502 may be coupled to the carrier 2504 through other forms of interconnects (e.g., landing pad grid array). Different implementations may use different materials for the carrier 2504. In some implementations, the carrier 2504 is a printed circuit board (PCB). In some implementations, the carrier 2504 is a substrate (e.g., laminated substrate).

FIG. 25 illustrates that the die package 2502 includes a first set of connectors 2512 and a second set of connectors 2522. Different implementations may use different die packages. Examples of die packages were further described in detail in FIGS. 21-22, and is further described in FIG. 26. In some implementations, the first set of connectors 2512 and the second set of connectors 2522 are die-to-wire connectors. The first set of connectors 2512 are located on the sides of the die package 2502 (e.g., on an encapsulation portion of the die package). However, the first set of connectors 2512 may be located on other portions of the die package 2502. The second set of connectors 2522 are located on a first surface (e.g., top surface) of the die package 2502 (e.g., on a top surface of an encapsulation portion of the die package 2502).

In some implementations, the first set of connectors 2512 and the second set of connectors 2522 are metal layers coupled to the die package 2502. The first set of connectors 2512 and the second set of connectors 2522 are configured to provide an electrical path for a signal (e.g., power signal, data signal). In some implementations, the first set of connectors 2512 are coupled to the carrier 2504 (e.g., traces of the carrier 2504). The second set of connectors 2522 are coupled to the first set of connectors 2512.

FIG. 25 further illustrates a connector header 2506. In some implementations, the connector header 2506 is a wire-to-die connector device. The connector header 2506 includes a third set of connectors 2516 and a fourth set of connectors 2526. The third set of connectors 2516 and the fourth set of connectors 2526 may include metal layers. The connector header 2506 also includes a set of wires (which are not visible), which are coupled to the third set of connectors 2516 and/or the fourth set of connectors 2526. In some implementations, the set of wires includes a set of cables. In some implementations, the connector header 2506 is configured to couple to a die package (e.g., die package 2502). For example, the third set of connectors 2516 of the connector header 2506 may be configured to couple to the first set of connectors 2512 of the die package 2502. Similarly, the fourth set of connectors 25126 of the connector header 2506 may be configured to couple to the second set of connectors 2522 of the die package 2502. In some implementations, the connector header 2506 is coupled to a power source (e.g., battery) and/or a data signal source. In some implementations, the connector header 2506 is configured to provide an electrical path from the power source to the die package 2502. In some implementations, the connector header 2506 is configured to provide an electrical path for data signal to the die package 2502.

Different implementations may provide different electrical paths for a power signal (from the power source) a data signal to the die package 2502, and/or a ground signal from the die package 2502.

In some implementations, a power signal from a power source and/or a data signal may traverse the wire of the connector header 2506, the third set of connectors, 2516, the fourth set of connectors 2526, the second set of connectors 2522, the first set of connectors 2512, a first set of traces in the carrier 2504, at least on capacitor coupled to the carrier 2504, a second set of traces in the carrier 2504, and/or at least a second solder ball from the set of solder balls 2508 to reach the die package 2502. In some implementations, a ground signal may traverse an identical path, a similar path or a different path.

The integrated device assembly 2500 of FIG. 25 provides several technical advantages over conventional integrated device assemblies. One, providing a wire-to-die connector header 2506 that directly couples to a die package saves valuable space on the carrier 2504, since the connector is implemented and/or integrated on the die package as opposed to being on the carrier 2504. Second, providing the connectors on the die package 2502 decreases the distance that a signal (e.g., power signal, data signal) has to travel to a die package, which can lead to improve and/or better signals to the die package, especially at low voltages. For example, in some implementations, the signal may bypass interconnects (e.g., traces, pads, vias) in the carrier (e.g., PCB). In some implementations, the signal may still traverse through some of the interconnects of the carrier, but the distance will be much less. Third, not having a separate connector that couples to a connector header reduces the cost and weight of the assembly 2500. Fourth, not having a separate connector on the carrier 2504 simplifies the design of interconnects (e.g., traces) in the carrier 2504, since interconnects on the carrier 2504 will not have to be designed around the connector.

Exemplary Die Package Comprising Die-to-Wire Connector

Figure 26:
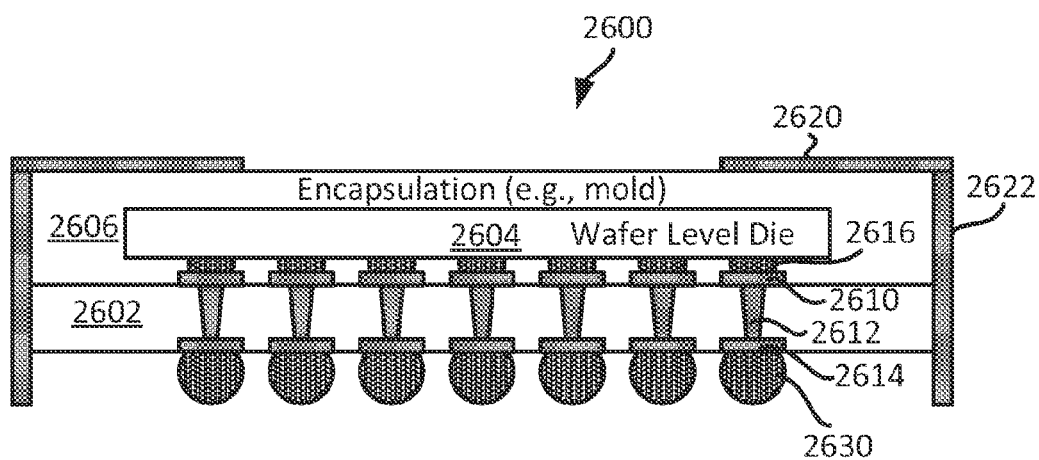
FIG. 26 illustrates a profile view of another die package that includes a die-to-wire connector.

FIG. 26 illustrates an example of a die package 2600 that includes a die-to-wire connector. As shown in FIG. 26, the die package 2600 includes a package substrate 2602, a wafer level die 2604, and an encapsulation layer 2606. The package substrate 2602 includes a first pad 2610, a via 2612, and a second pad 2614. The first pad 2610 is on a first surface of the package substrate 2602. The via 2612 traverses the package substrate 2602. The second pad 2614 is embedded in a second surface of the package substrate 2602. The first pad 2610 is coupled the via 2612. The via 2612 is coupled to the second pad 2614.

The wafer level die 2604 is coupled to the package substrate 2602. Specifically, the wafer level die 2604 is coupled to the first pad 2610 of the package substrate 2602. In particular, the wafer level die 2604 is coupled to the first pad 2610 through a first solder ball 2616. In some implementations, the first solder ball 2616 may be used or replaced with other forms of interconnects, such as pillars (e.g., copper pillar). Thus, the wafer level die 2604 may be coupled to the first pad 2610 through other forms of interconnects and is therefore not limited to the first solder ball 2616 shown in FIG. 26.

FIG. 26 also illustrates that the encapsulation layer 2606 encapsulates the wafer level die 2604. Different implementations may use different materials for the encapsulation layer 2606. In some implementations, the encapsulation layer 2606 includes one of at least a mold, a polymer, and/or a fill.

FIG. 26 further illustrates a first set of interconnects 2620 and a second set of interconnects 2622. The first set of interconnects 2620 and the second set of interconnects 2622 are configured to operate as a die-to-wire connector for the die package 2600. The first set of interconnects 2620 is coupled to the second set of interconnects 2622.

The first set of interconnects 2620 is located on a first surface (e.g., top surface) of the encapsulation layer 2606. In some implementations, the first set of interconnects 2620 is embedded in the first surface of the encapsulation layer 2606.

The second set of interconnects 2622 is located on a second surface (e.g., side surface) of the encapsulation layer 2606 and/or a side surface of the package substrate 2602. In some implementations, the second set of interconnects 2622 is embedded in the second surface of the encapsulation layer 2606 and/or the side surface of the package substrate 2602.

Different implementations may provide different electrical paths between the first set of interconnects 2620 and the wafer level die 2604. In some implementations, an electrical path between the first set of interconnects 2620 and the wafer level die 2604 includes one of at least the second set of interconnects 2622, at least one interconnect outside of the die package 2600, the solder ball 2630, the via 2612, the first pad 2610, and/or the solder balls 2616.

FIG. 26 illustrates the die package 2600 has having one wafer level die. However, in some implementations, the die package 2600 may include two or more wafer level dies.

Exemplary Electronic Devices

Figure 27:
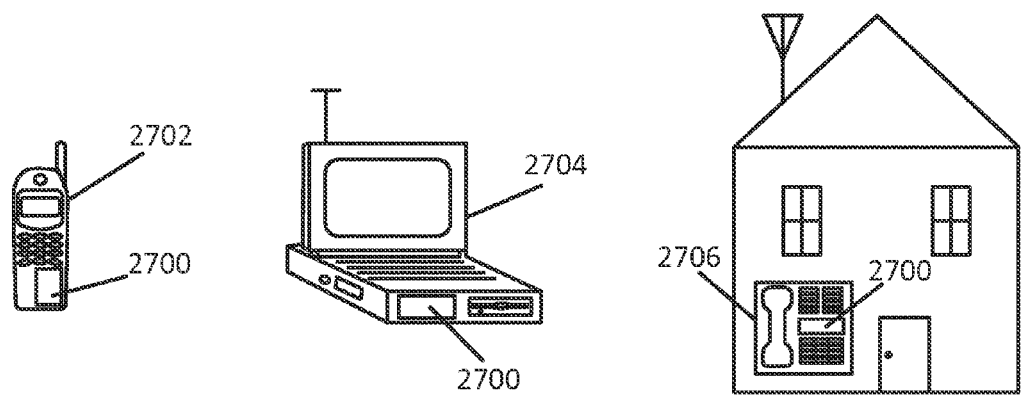
FIG. 27 illustrates various electronic devices that may integrate an integrated device, a connector, a semiconductor device, a die, a package substrate, an integrated circuit and/or PCB described herein.

FIG. 27 illustrates various electronic devices that may be integrated with any of the aforementioned integrated device, connector, connector device, semiconductor device, package substrate, integrated circuit, die, interposer or package. For example, a mobile telephone 2702, a laptop computer 2704, and a fixed location terminal 2706 may include an integrated device 2700 as described herein. The integrated device 2700 may be, for example, any of the integrated circuits, dice or packages described herein. The devices 2702, 2704, 2706 illustrated in FIG. 27 are merely exemplary. Other electronic devices may also feature the integrated device 2700 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 3, 4, 5, 6, 7, 8, 9, 10, 11, 12, 13, 14, 15, 16, 17, 18, 19, 20, 21, 22, 23, 24, 25, 26 and/or 27 may be rearranged and/or combined into a single component, step, feature or function or embodied in several components, steps, or functions. Additional elements, components, steps, and/or functions may also be added without departing from the disclosure. It should also be noted that FIGS. 3, 4, 5, 6, 7, 8, 9, 10, 11, 12, 13, 14, 15, 16, 17, 18, 19, 20, 21, 22, 23, 24, 25, 26 and/or 27 and its corresponding description in the present disclosure is not limited to dies and/or ICs. In some implementations, FIGS. 3, 4, 5, 6, 7, 8, 9, 10, 11, 12, 13, 14, 15, 16, 17, 18, 19, 20, 21, 22, 23, 24, 25, 26 and/or 27 and its corresponding description may be used to manufacture, create, provide, and/or produce integrated devices. In some an integrated device may include a die package, package substrate, an integrated circuit (IC), a wafer, a semiconductor device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other. The term "cavity" is used herein to refer to a hollow, a space and/or a hole in an object. A cavity may partially or fully traverse an object.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device package comprising:
   a package substrate comprising a first surface, a second surface, and an exterior side surface;
   a die coupled to the first surface of the package substrate;
   an encapsulation layer at least partially encapsulating the die, the encapsulation layer comprising a first exterior surface; and
   a first plurality of metal layers coupled to the first exterior surface of the encapsulation layer and the exterior side surface of the package substrate.

2. The integrated device package of claim 1, further comprising a second plurality of metal layers coupled to the first plurality of metal layers and the second surface of the package substrate, wherein the second surface is opposite to the first surface of the package substrate.

3. The integrated device package of claim 2, further comprising a plurality of solder balls coupled to the second plurality of metal layers.

4. The integrated device package of claim 1, wherein the first plurality of metal layers is configured to operate as a die-to-wire connector of the integrated device package.

5. The integrated device package of claim 1, further comprising a second plurality of metal layers coupled to a second exterior surface of the encapsulation layer, wherein the first exterior surface comprises a side surface of the encapsulation layer, and the second exterior surface comprises a top surface of the encapsulation layer.

6. The integrated device package of claim 1, wherein the integrated device package is coupled to a carrier, the first plurality of metal layers being configured to directly couple to the carrier.

7. The integrated device package of claim 1, wherein the first plurality of metal layers is configured to provide an electrical path for one of at least a power signal and/or a data signal to the integrated device package.

8. The integrated device package of claim 1, wherein the integrated device package is one of at least a die package and/or a chip package.

9. The integrated device package of claim 1, wherein the integrated device package is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

10. An apparatus comprising:
   an integrated device package comprising:
      a package substrate comprising a first surface, a second surface, and an exterior side surface;
      a die coupled to the first surface of the package substrate;
      an encapsulation layer at least partially encapsulating the die, the encapsulation layer comprising a first exterior surface; and
      a first means for providing a die-to-wire electrical connection, the first means coupled to the first exterior surface of the encapsulation layer and the exterior side surface of the package substrate; and
   a wire-to-die connector coupled to the integrated device package such that the wire-to-die connector at least laterally surrounds the integrated device package, wherein the wire-to-die connector is electrically coupled to the first means.

11. The apparatus of claim 10, wherein the first means is further coupled to the second surface of the package substrate.

12. The apparatus of claim 10, wherein the first means is further coupled to a second exterior surface of the encapsulation layer, wherein the first exterior surface comprises a side surface of the encapsulation layer, and the second exterior surface comprises a top surface of the encapsulation layer.

13. The apparatus of claim 10, further comprising a carrier coupled to the integrated device package, wherein the first means is directly coupled to the carrier.

14. The apparatus of claim 10, wherein the first means is for providing an electrical path for one of at least a power signal and/or a data signal to the apparatus.

15. The apparatus of claim 10, wherein the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

16. A wire-to-die connector comprising:
   a casing comprising a cavity, wherein the cavity is configured to couple to an integrated device package such that the casing at least laterally surrounds the integrated device package, wherein the integrated device package comprises an encapsulation layer and a first plurality of metal layers coupled to the encapsulation layer;
   a wire casing coupled to the casing;
   a plurality of wires in the wire casing; and
   a second plurality of metal layers coupled to the plurality of wires, the second plurality of metal layers being located in the casing, wherein the second plurality of metal layers is configured to couple to the first plurality of metal layers of the integrated device package.

17. The wire-to-die connector of claim 16, wherein the second plurality of metal layers and the plurality of wires are configured to provide an electrical path for one of at least a power signal and/or a data signal to the integrated device package.

18. The wire-to-die connector of claim 16, further comprising a shield layer located within the casing, wherein the shield layer comprises an electromagnetic interference (EMI) shielding.

19. The wire-to-die connector of claim 16, wherein the cavity forms a first interior surface and a second interior surface in the casing, the second plurality of metal layers being coupled to the first interior surface of the casing.

20. The wire-to-die connector of claim 19, further comprising a third plurality of metal layers coupled to the plurality of wires, wherein the third plurality of metal layers is coupled to the second interior surface of the casing.

21. The-wire-to-die connector of claim 16, further comprising:
   a first plurality of interconnects coupled to the first plurality of metal layers; and
   a first plurality of interfaces coupled to the plurality of wires and the first plurality of interconnects.

22. The wire-to-die connector of claim 16, wherein the wire-to-die connector is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

23. An apparatus comprising:
   a casing comprising a cavity, wherein the cavity is configured to couple to an integrated device package such that the casing at least laterally surrounds the integrated device package, wherein the integrated device package comprises an encapsulation layer and a first plurality of metal layers coupled to the encapsulation layer;
   a wire casing coupled to the casing;
   a plurality of wires in the wire casing; and
   a first means for providing an electrical connection, the first means coupled to the plurality of wires, the first means being located in the casing, wherein the first means is configured to couple to the first plurality of metal layers of the integrated device package.

24. The apparatus of claim 23, wherein the first means and the plurality of wires are configured to provide an electrical path for one of at least a power signal and/or a data signal to the integrated device package.

25. The apparatus of claim 23, further comprising a shielding means layer located within the casing.

26. The apparatus of claim 23, wherein the cavity forms a first interior surface and a second interior surface in the casing, the first means being coupled to the first interior surface of the casing.

27. The apparatus of claim 26, wherein the first means is further coupled to the second interior surface of the casing.

28. The apparatus of claim 23, further comprising:
   a first plurality of interconnects coupled to the first means; and
   a first interface means configured to couple the first plurality of interconnects and the plurality of wires.

29. The apparatus of claim 23, wherein the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

30. The integrated device package of claim 1, wherein the die is electrically coupled to the package substrate through a plurality of solder balls located between the die and the first surface of the package substrate.

31. The integrated device package of claim 1, wherein the integrated device package is coupled to a wire-to-die connector such that the wire-to-die connector at least laterally surrounds the integrated device package, wherein the wire-to-die connector is electrically coupled to the first plurality of metal layers.

32. The integrated device package of claim 31, wherein the integrated device package comprises a first cross-section, and the wire-to-die connector comprises a cavity comprising a second cross-section that allows the integrated device package to fit within the cavity of the wire-to-die connector.

33. The apparatus of claim 10, further comprising a carrier, wherein an electrical signal between the wire-to-die connector and the die traverses at least through the carrier.

34. The wire-to-die connector of claim 16, wherein the cavity comprises a first cross-section, and the integrated device package comprises a second cross-section that allows the integrated device package to fit within the cavity of the casing.

* * * * *